(12) United States Patent
Lee et al.

(10) Patent No.: US 12,456,652 B2
(45) Date of Patent: Oct. 28, 2025

(54) METHOD AND SYSTEM OF MANUFACTURING DISPLAY DEVICE

(71) Applicant: Samsung Display Co., LTD., Yongin-si (KR)

(72) Inventors: Tae Hee Lee, Yongin-si (KR); Sung Kook Park, Yongin-si (KR); Joo Woan Cho, Yongin-si (KR); Jin Woo Choi, Yongin-si (KR); Hae Yun Choi, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 856 days.

(21) Appl. No.: 17/708,693

(22) Filed: Mar. 30, 2022

(65) Prior Publication Data

US 2022/0352042 A1    Nov. 3, 2022

(30) Foreign Application Priority Data

Apr. 29, 2021   (KR) .................. 10-2021-0056007

(51) Int. Cl.
| | |
|---|---|
| *H01L 21/66* | (2006.01) |
| *H01L 33/00* | (2010.01) |
| *H10H 20/01* | (2025.01) |
| *H01L 25/075* | (2006.01) |

(52) U.S. Cl.
CPC ............. *H01L 22/12* (2013.01); *H01L 22/14* (2013.01); *H01L 22/32* (2013.01); *H10H 20/01* (2025.01); *H01L 25/0753* (2013.01)

(58) Field of Classification Search
CPC ......... H01L 22/12; H01L 22/14; H01L 22/32; H10H 20/01
See application file for complete search history.

(56) References Cited

U.S. PATENT DOCUMENTS

| | | | |
|---|---|---|---|
| 7,125,747 B2 | 10/2006 | Lee et al. | |
| 7,321,134 B2* | 1/2008 | Yoo .................... | H10K 59/1275 |
| | | | 257/E51.019 |
| 10,181,507 B2 | 1/2019 | Bower et al. | |
| 10,395,966 B2* | 8/2019 | Bower .................. | B65G 47/91 |

(Continued)

FOREIGN PATENT DOCUMENTS

| | | |
|---|---|---|
| KR | 10-1097801 | 12/2011 |
| KR | 10-2015-0047365 | 5/2015 |

(Continued)

*Primary Examiner* — Peniel M Gumedzoe
(74) *Attorney, Agent, or Firm* — CANTOR COLBURN LLP

(57) ABSTRACT

In a method of manufacturing a display device, first and second panels are aligned by using an alignment apparatus. The first panel includes pixel driving circuits arranged on a first substrate, each of the pixel driving circuits includes a transistor and a pixel electrode connected to the transistor, and the second panel includes light emitting elements arranged on a second substrate. An end portion of at least one of the light emitting elements is bonded to the pixel electrode by using a bonding apparatus, and a lighting test is performed on a mother panel by using a test apparatus. The mother panel includes the first panel and the second panel, and is divided into a plurality of display panels in plan view. A defect management map for the plurality of display panels is generated based on a result of the lighting test.

13 Claims, 16 Drawing Sheets

(56) References Cited

U.S. PATENT DOCUMENTS

| | | | |
|---|---|---|---|
| 10,636,349 B2 | 4/2020 | Shin et al. | |
| 2003/0201445 A1* | 10/2003 | Park | H10K 59/1275 257/79 |
| 2013/0068368 A1 | 3/2013 | Kim et al. | |

FOREIGN PATENT DOCUMENTS

| | | |
|---|---|---|
| KR | 10-2018-0118488 | 10/2018 |
| KR | 10-2020-0128325 | 11/2020 |

* cited by examiner

FIG. 10

| X\Y | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| 1 |   |   |   |   | 1 | 76 | 1 | 1 | 1 | 1  |    |    |    |    |
| 2 |   |   | 1 | 1 | 76 | 73 | 1 | 76 | 1 | 1 | 1  |    |    |    |
| 3 |   | 1 | 76 | 76 | 1 | 1 | 76 | 76 | 1 | 1 | 1  |    |    |    |
| 4 |   | 76 | 76 | 1 | 1 | 1 | 1 | 76 | 76 | 1 | 73 | 1  | 76 |    |
| 5 | 1 | 1 | 1 | 1 | 76 | 1 | 1 | 1 | 1 | 76 | 1  | 1  | 1  | 1  |
| 6 |   | 1 | 76 | 1 | 1 | 1 | 1 | 1 | 1 | 1  | 1  | 76 | 1  |    |
| 7 |   |   | 1 | 1 | 1 | 76 | 1 | 1 | 1 | 1  | 1  | 76 |    |    |
| 8 |   |   | 76 | 76 | 1 | 1 | 1 | 1 | 76 | 1 | 1  |    |    |    |
| 9 |   |   |   |   | 1 | 1 | 1 | 1 | 73 | 1 |    |    |    |    |

170: 170a, 170b

METHOD AND SYSTEM OF MANUFACTURING DISPLAY DEVICE

CROSS-REFERENCE TO RELATED APPLICATION(S)

This application claims priority to and benefits of Korean Patent Application 10-2021-0056007 under 35 U.S.C. § 119(a), filed on Apr. 29, 2021 in the Korean Intellectual Property Office, the entire contents of which is incorporated herein by reference.

BACKGROUND

1. Technical Field

The disclosure generally relates to a method and a system of manufacturing a display device.

2. Related Art

Recently, as interest in information displays has increased, research and development of display devices has been continuously conducted.

SUMMARY

Embodiments provide a method and a system of manufacturing a display device, which can simplify manufacturing processes and manufacturing facilities of the display device.

In accordance with an aspect of the disclosure, a method of manufacturing a display device may include aligning a first panel and a second panel by using an alignment apparatus, wherein the first panel may include pixel driving circuits arranged on a first substrate, each of the pixel driving circuits may include a transistor and a pixel electrode connected to the transistor, and the second panel may include light emitting elements arranged on a second substrate, bonding an end portion of at least one of the light emitting elements to the pixel electrode by using a bonding apparatus, performing a lighting test on a mother panel by using a test apparatus, wherein the mother panel may include the first panel and the second panel, and may be divided into a plurality of display panels in plan view, and generating a defect management map for the plurality of display panels, based on a result of the lighting test.

The alignment apparatus, the bonding apparatus, and the test apparatus may be provided in one chamber.

The first panel may be fixed onto the alignment apparatus. The aligning of the first panel and the second panel may include adjusting a position of the first panel with respect to the second panel on a first plane by using the alignment apparatus, wherein the first plane may be defined by a first direction and a second direction, and moving the first panel in a third direction by using the alignment apparatus such that the first panel may contact the second panel.

The bonding of the end portion of the at least one of the light emitting elements to the pixel electrode may include irradiating laser light or applying heat between the end portion of the at least one of the light emitting elements and the pixel electrode.

The bonding of the end portion of the at least one of the light emitting elements to the pixel electrode may further include separating the second substrate from the mother panel.

The performing of the lighting test on the mother panel may include adjusting a position of the mother panel with respect to the test apparatus by using the alignment apparatus, and moving the mother panel toward the test apparatus by using the alignment apparatus such that a probe pin of the test apparatus electrically contacts a pad which may be provided in the mother panel and may be electrically connected to the transistor.

The performing of the lighting test on the mother panel may further include moving the mother panel by using the alignment apparatus such that the plurality of display panels may be sequentially aligned with the test apparatus, and sequentially performing the lighting test on the plurality of display panels by using the test apparatus.

The alignment apparatus may be located on the test apparatus. The performing of the lighting test on the mother panel may further include overturning the mother panel such that a pad provided in the mother panel faces the test apparatus by using a rotating apparatus coupled to the alignment apparatus.

The performing of the lighting test on the mother panel may further include applying a test voltage to the pad, measuring a current flowing through the pad to the at least one of the light emitting elements, and determining whether the at least one of the light emitting elements normally emits light by comparing the current with a reference current.

The defect management map may include position information of each of the plurality of display panels, and a test result information set corresponding to the position information. The test result information may include a first code value representing that all light emitting elements provided in a corresponding display panel normally emit light, or a second code value representing that all the light emitting elements abnormally emit light or emit no light.

The method may further include acquiring at least one display panel from the mother panel, based on the defect management map.

The acquiring of the at least one display panel from the mother panel may include separating, from the mother panel, the at least one display panel which is normally operating among the plurality of display panels, based on the defect management map.

The acquiring of the at least one display panel from the mother panel may include irradiating laser light onto the mother panel by using a cutting apparatus, and moving the mother panel by using the alignment apparatus such that the laser light may be irradiated onto the mother panel along a predefined cutting line.

In accordance with an aspect of the disclosure, a system of manufacturing a display device may include a chamber, an alignment apparatus disposed in the chamber, the alignment apparatus fixing to a first panel and controlling a position of the first panel, wherein the first panel may include pixel driving circuits arranged on a first substrate, and each of the pixel driving circuits may include a transistor and a pixel electrode connected to the transistor, a bonding apparatus disposed in the chamber, the bonding apparatus fixing to a second panel and bonding an end portion of at least one of light emitting elements arranged on a second substrate to the pixel electrode of the first panel, wherein the light emitting elements may be included in the second panel, and a test apparatus disposed in the chamber, the test apparatus performing a lighting test on a mother panel, wherein the mother panel may include the first panel and the second panel, and may be divided into a plurality of display panels in plan view, and the test apparatus generates a defect management map for the plurality of display panels, based on a result of the lighting test.

The alignment apparatus may adjust a position of the first panel with respect to the second panel on a first plane. The first plane may be defined by a first direction and a second direction. The alignment apparatus may move the first panel in a third direction such that the first panel may be in contact with the second panel.

The alignment apparatus may adjust a position of the mother panel with respect to the test apparatus, and move the mother panel toward the test apparatus such that a probe pin of the test apparatus electrically contacts a pad of the mother pad. The pad may be electrically connected to the light emitting element through the transistor.

The alignment apparatus may move the mother panel such that the plurality of display panels may be sequentially aligned with the test apparatus. The test apparatus may sequentially perform the lighting test on the plurality of display panels.

The system may further include a cutting apparatus separating at least one display panel from the mother panel, based on the defect management map.

BRIEF DESCRIPTION OF THE DRAWINGS

Example embodiments will now be described more fully hereinafter with reference to the accompanying drawings. However, the disclosure may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 10 is a diagram schematically illustrating an embodiment of a defect management map generated in the test apparatus included in the system shown in FIG. 1A.

DETAILED DESCRIPTION OF THE EMBODIMENTS

Figure 1A:
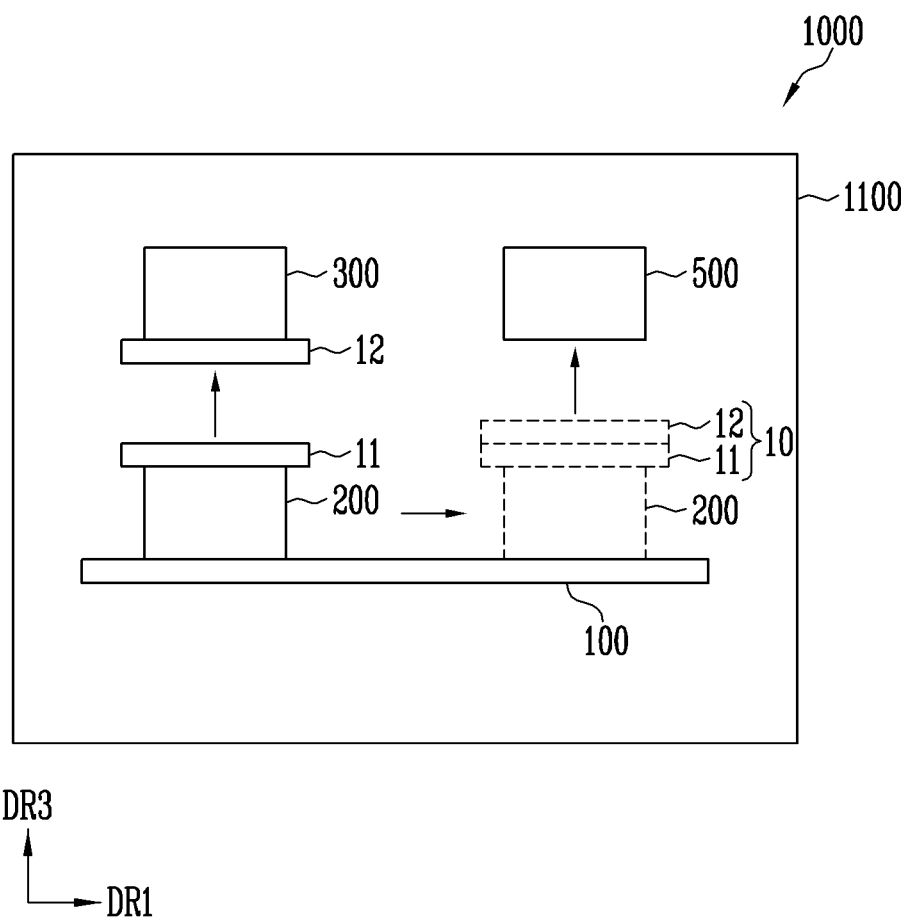
FIGS. 1A to 1C are diagrams schematically illustrating a system of manufacturing a display device in accordance with embodiments of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well (and vice versa), unless the context clearly indicates otherwise.

It will be further understood that the terms "comprises", "has", "includes", and the like, when used herein, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. An expression that an element such as a layer, region, substrate or plate is placed "beneath" or "below" another element indicates not only a case where the element is placed "directly beneath" or "just below" the other element but also a case where a further element is interposed between the element and the other element.

It will be understood that, when an element (for example, a first element) is "(operatively or communicatively) coupled with/to" or "connected to" another element (for example, a second element), the element may be directly coupled with/to another element, or there may be an intervening element (for example, a third element) between the element and another element. It will be understood that, when an element (for example, a first element) is "directly coupled with/to" or "directly connected to" another element (for example, a second element), there may be no intervening element (for example, a third element) between the element and another element.

It will be understood that the terms "connected to" or "coupled to" may include a physical or electrical connection or coupling.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
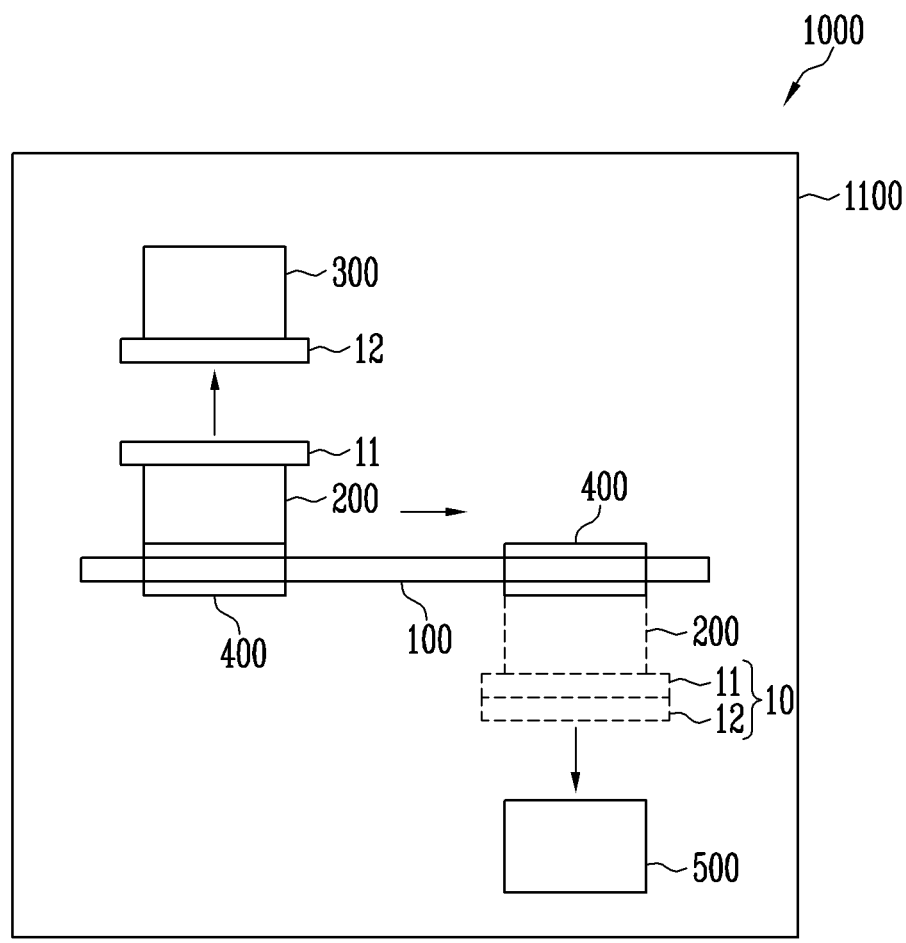
Figure 1C:
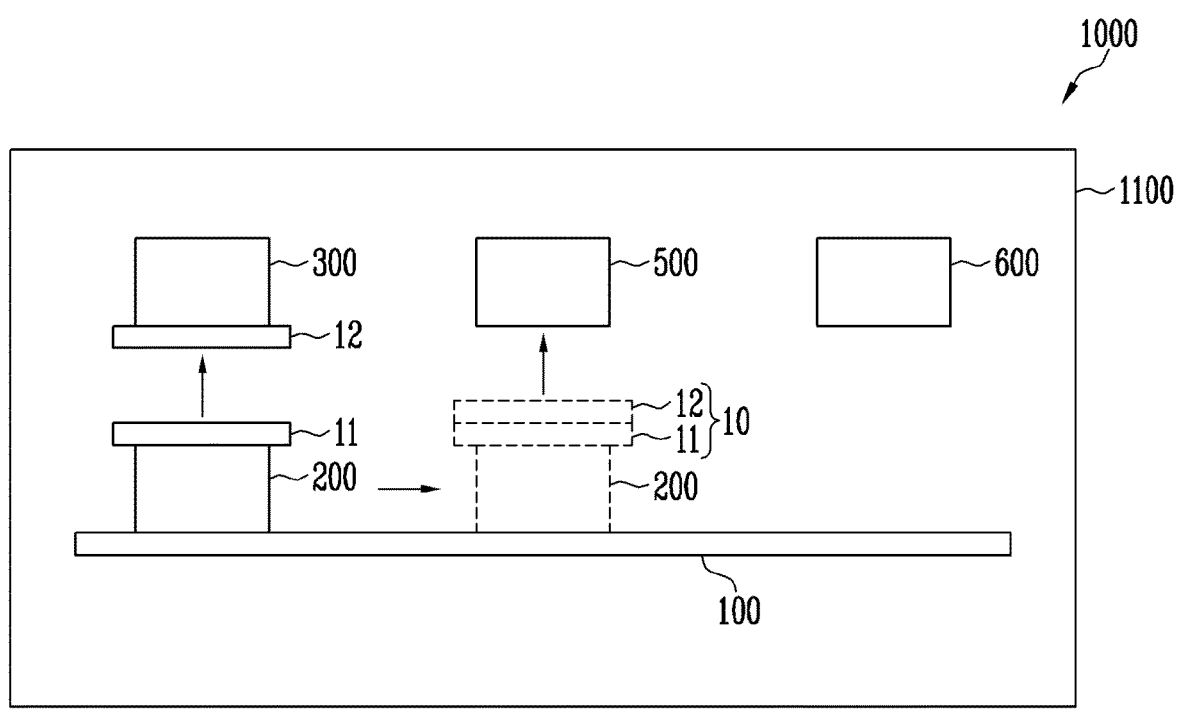

FIGS. 1A to 1C are diagrams schematically illustrating a system of manufacturing a display device in accordance with embodiments of the disclosure.

Referring to FIGS. 1A to 1C, the system 1000 may manufacture various kinds of display devices or display panels. The display panel may include pixels, and each of the pixels may include at least one light emitting element (e.g., see "LD" shown in FIG. 9) and a pixel driving circuit (see "PXC" shown in FIG. 9) for driving the at least one light emitting element. The system 1000 may manufacture a mother panel 10 in which multiple display panels (display cells, or cells) may be included, by coupling or bonding a first panel 11 (or wafer) in which pixel driving circuits may be arranged and a second panel 12 (or LED chip array) in which light emitting elements may be arranged. The system 1000 may test whether a defect occurs in the display panels (e.g., whether the display panels normally light) in a state in which the display panels may be included in the mother panel 10, and separate or acquire only normal display panels from the mother panel 10. To this end, the system 1000 may include a chamber 1100, and a transfer apparatus 100, an alignment apparatus 200, a bonding apparatus 300, and a test apparatus 500 in the chamber 1100.

The chamber 1100 may provide an enclosed internal space. The internal space of the chamber 1100 may be maintained in a vacuum state, or a process gas (e.g., nitrogen) used in a manufacturing process of a display device may be uniformly distributed in the internal space of the chamber 1100. The chamber 1100 may provide the enclosed internal space, to prevent contamination of the process gas and to block an impurity from being introduced into the chamber 1100 from the outside.

The transfer apparatus 100 may be movably mounted in the chamber 1100. The transfer apparatus 100 may move the first panel 11 (lower panel, or lower plate) to a position corresponding to the bonding apparatus 300 such that a bonding process on the first panel 11 can be performed. The transfer apparatus 100 may move the mother panel 10 to a position corresponding to the test apparatus 500 such that a lighting test process on the mother panel 10 can be performed. For example, in case that the bonding apparatus 300 and the test apparatus 500 are sequentially located along a first direction DR1, the transfer apparatus 100 may move the first panel 11 or the mother panel 10 along the first direction DR1.

For example, the transfer apparatus 100 may include a moving path providing unit (e.g., a rail) and a stage movably coupled to the moving path providing unit. The transfer apparatus 100 may include a driving unit (e.g., a motor or the like) for moving the stage along the moving path providing unit. The first panel 11 or the mother panel 10 may be disposed, fixed, or mounted on the stage. The moving path providing unit may be disposed to pass through positions corresponding to the bonding apparatus 300 and the test apparatus 500 or provide a moving path including the positions, and the transfer apparatus 100 may move the stage to the positions.

The alignment apparatus 200 may be movably coupled to the transfer apparatus 100 (or the stage of the transfer apparatus 100), and support and fix the first panel 11. For example, the first panel 11 may be fixed to or mounted on a surface (e.g., a top surface) of the alignment apparatus 200.

In an embodiment, the alignment apparatus 200 may align the first panel 11 with respect to the second panel 12. For example, the alignment apparatus 200 and the first panel 11 may be moved to a position corresponding to the bonding apparatus 300 by the transfer apparatus 100. Subsequently, the alignment apparatus 200 may accurately adjusted or calibrate the position of the first panel 11 with respect to the second panel 12 fixed to the bonding apparatus 300. For example, the alignment apparatus 200 may adjust the position of the first panel 11 such that a first alignment mark included in the first panel 11 may be located on the same line (e.g., a virtual line extending in a third direction DR3) as a second alignment mark included in the second panel 12. For example, the alignment apparatus 200 may adjust the position of the first panel 11 in a unit of about 2 μm.

The alignment apparatus 200 may move the aligned first panel 11 in the third direction DR3. For example, the alignment apparatus 200 may adjust the position of the first panel 11 in the third direction DR3 in the unit of about 2 μm, and allow the first panel 11 to be in contact with the second panel 12.

In an embodiment, the alignment apparatus 200 may align the mother panel 10 with respect to the test apparatus 500. For example, the alignment apparatus 200 and the mother panel 10 may be moved to a position corresponding to the test apparatus 500 by the transfer apparatus 100. Subsequently, the alignment apparatus 200 may accurately adjust the position of the mother panel 10 with respect to the test apparatus 500. The alignment apparatus 200 may allow the mother panel 10 to be in contact with the test apparatus 500 or allow the mother panel 10 to be separated from the test apparatus 500 by moving the aligned mother panel 10 in the third direction DR3. An operation of the alignment apparatus 200 will be described later with reference to FIG. 4. In some embodiments, the alignment apparatus 200 may be included in the transfer apparatus 100.

The bonding apparatus 300 may support or fix the second panel 12. For example, the second panel 12 may be fixed to or mounted on a surface (e.g., a bottom surface) of the bonding apparatus 300.

The bonding apparatus 300 may bond or couple the first panel 11 and the second panel 12, thereby manufacturing the mother panel 10. For example, in a state in which a pixel electrode exposed on a top surface of the first panel 11 and a first end portion of at least one light emitting element exposed on a bottom surface of the second panel 12 may be in contact with or connected to each other, the bonding apparatus 300 may irradiate laser light onto or apply heat to an area in which the pixel electrode and the at least one light emitting element may be in contact with each other, so that the pixel electrode and the at least one light emitting element can be bonded or coupled to each other. An operation of the bonding apparatus 300 will be described later with reference to FIG. 6.

The test apparatus 500 may perform a lighting test on the mother panel 10. For example, the test apparatus 500 may apply an electrical signal (e.g., a test voltage) to the mother panel 10 (or pads provided in the mother panel 10), and check whether the mother panel 10 (or light emitting elements provided in the mother panel 10) normally lights in response to the electrical signal. In case that the mother panel 10 includes multiple display panels, the test apparatus 500 may perform the lighting test on each of the display panels.

In an embodiment, the test apparatus 500 may generate a defect management map, based on a result of the lighting test. The defect management map may include information on a result of the lighting test or a defect occurring in each of the display panels. Whether each of the display panels may be a good product may be checked based on the defect management map. For example, in case that a specific display panel normally lights through the lighting test, the defect management map may include a value representing that the display panel may be a good product. The test apparatus 500 will be described later with reference to FIG. 7.

In an embodiment, as shown in FIG. 1B, the test apparatus 500 may be disposed under the transfer apparatus 100. In order to prevent contamination of the mother panel 10 from particles generated during a test, the test may be performed in a face-down state in which the second panel 12 may be located on the bottom of the first panel 11 with respect to the first panel 11. In order to change the position of the mother panel 10 from a face-up state in which the second panel 12 may be located on the top of the first panel 11 with respect to the first panel 11 to the face-down state, the system 1000 may further include a rotating apparatus 400.

The rotating apparatus 400 may be rotatably coupled to the transfer apparatus 100, and the alignment apparatus 200 may be movably coupled to the rotating apparatus 400. For example, the transfer apparatus 100 may move the rotating apparatus 400 to positions corresponding to the bonding apparatus 300 and the test apparatus 500. The rotating apparatus 400 may locate the alignment apparatus 200 to face upwardly in a bonding process (i.e., face up), and locate the alignment apparatus 200 to face downwardly in a test process (i.e., face down). In some embodiments, the rotating apparatus 400 may be included in the transfer apparatus 100.

In an embodiment, as shown in FIG. 1C, the system 1000 may further include a cutting apparatus 600 in the chamber 1100. The transfer apparatus 100 may move the mother panel 10 to a position corresponding to the cutting apparatus 600.

The cutting apparatus 600 may cut (or scribe) or separate the mother panel 10 into multiple display panels. For example, the cutting apparatus 600 may separate the mother panel 10 into the display panels by irradiating laser light onto the mother panel 10 along a predefined cutting line (or scribing line). In an embodiment, the cutting apparatus 600 may perform a cutting process only with respect to display panels which may be good products or separate the display panels from the mother panel 10, based on the defect management map.

In some embodiments, the cutting apparatus 600 may irradiate only laser light onto the mother panel 10, and the alignment apparatus 200 may move the mother panel 10 such that the laser light may be irradiated along the cutting line.

As described above, the system 1000 may include the bonding apparatus 300 and the test apparatus 500 in the chamber 1100, and may perform a bonding process between the first panel 11 and the second panel 12 and a lighting test process on the mother panel 10. The system 1000 may align the first panel 11 with respect to the second panel 12 by using one alignment apparatus 200, and may align the mother panel 10 with respect to the test apparatus 500. For example, an alignment unit used in the bonding process and an alignment unit used in the lighting test process may be implemented as one alignment apparatus 200, so that the system 1000 can be simplified.

The system 1000 may generate a defect management map through a lighting test on the mother panel 10, and may perform a separation process (or scribing process) on only display panels which may be good products, based on the defect management map. Thus, the manufacturing process of a display device can be simplified, as compared with a method of individually performing a lighting test on each of multiple display panels after a separation process on the display panels.

Figure 2:
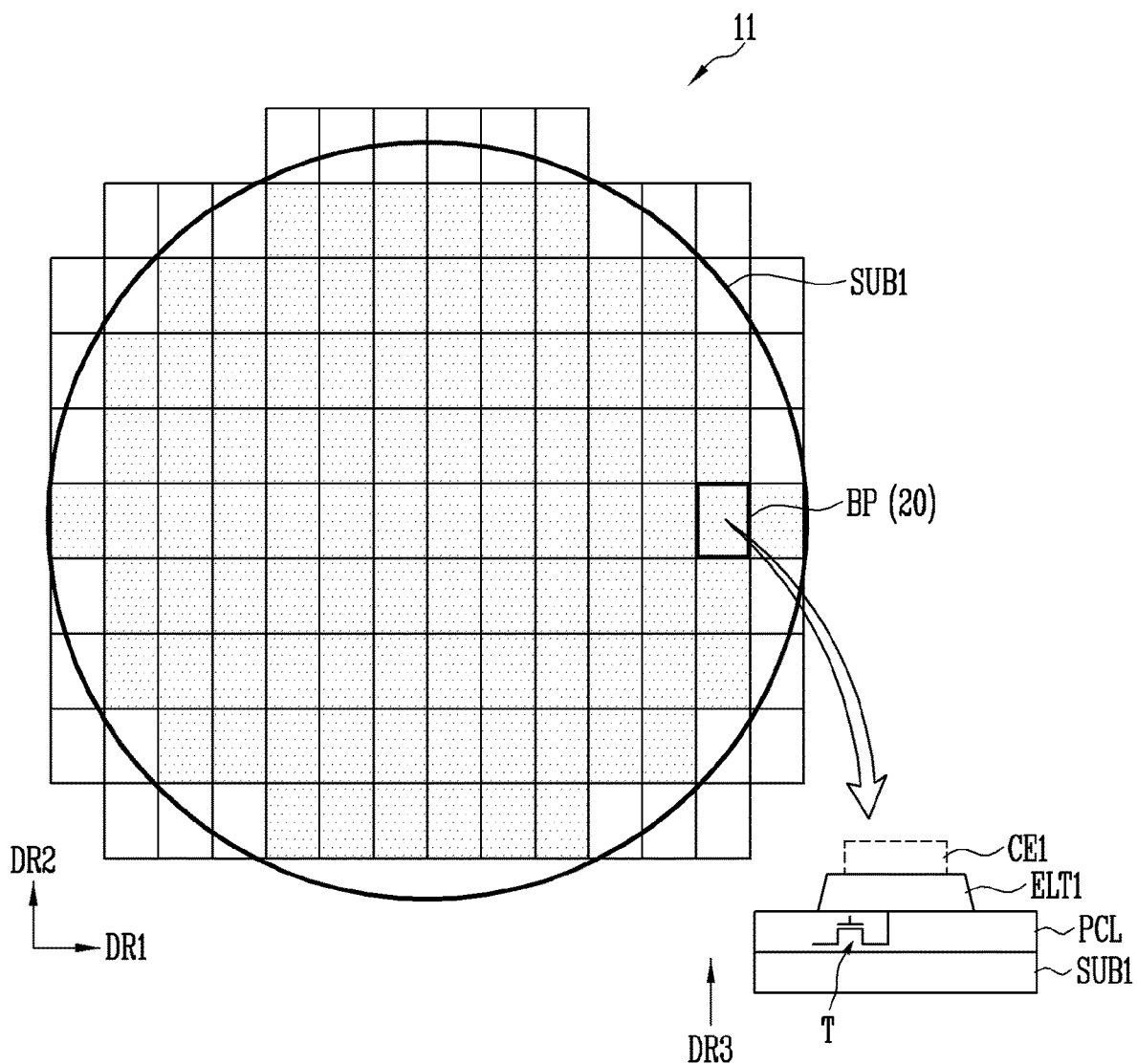
FIG. 2 is a diagram schematically illustrating an embodiment of a first panel used in the system shown in FIG. 1A.

FIG. 2 is a diagram schematically illustrating an embodiment of the first panel used in the system shown in FIG. 1A.

Referring to FIGS. 1A and 2, the first panel 11 may have various shapes. In an example, the first panel 11 may be provided in a circular plate shape, but the disclosure is not limited thereto. For example, the first panel 11 may have a rectangular planar shape.

The first panel 11 may be divided into multiple cells BP by scribing lines extending in the first direction DR1 and a second direction DR2, and each of the cells BP may correspond to one display panel 20 (or package). For example, each of the cells BP may constitute one display panel 20, and include pixel driving circuits respectively constituting multiple pixels included in the display panel 20. Each of the cells BP may have a rectangular planar shape. However, the disclosure is not limited thereto, and each of the cells BP may have a circular or elliptical shape.

The first panel 11 (and each of the cells BP) may include a first substrate SUB1 and a pixel circuit layer PCL disposed on the first substrate SUB1. The first substrate SUB1 may be made of an insulative material such as glass or resin. The first substrate SUB1 may be made of a material having flexibility to be bendable or foldable, and have a single- or multi-layered structure.

The pixel circuit layer PCL may include pixel driving circuits. For example, the pixel driving circuit may include a transistor T and a signal line connected to the transistor T. For example, the transistor T may be provided in a form in which a semiconductor layer, a gate electrode, and a source/drain electrode may be sequentially stacked with an insulating layer interposed therebetween. The semiconductor layer may include amorphous silicon, poly-silicon, low temperature poly-silicon, an oxide semiconductor, an organic semiconductor, or a combination thereof. The gate electrode and the source/drain electrode may include at least one of aluminum (Al), copper (Cu), titanium (T), and molybdenum (Mo), but the disclosure is not limited thereto.

A first electrode ELT1 (or pixel electrode) connected to the transistor T may be disposed on the pixel circuit layer PCL. In an example, the first electrode ELT1 may be an anode electrode.

The first electrode ELT1 may be coupled or bonded to light emitting elements LD (see FIG. 3) which will be described later.

The first electrode ELT1 may guide light emitted from the light emitting elements LD in the third direction DR3. To this end, the first electrode ELT1 may be made of a conductive material (or substance) having a constant reflexibility. The conductive material (or substance) may include an opaque metal. The opaque metal may include, for example, a metal such as silver (Ag), magnesium (Mg), aluminum (Al), platinum (Pt), palladium (Pd), gold (Au), neodymium (Nd), iridium (Ir), chromium (Cr), titanium (Ti), molybdenum (Mo), or any alloy thereof.

In an embodiment, a first contact electrode CE1 may be further disposed on the first electrode ELT1. The first contact electrode CE1 may be a bonding metal which allows the first electrode ELT1 to be coupled to the light emitting elements LD (see FIG. 3) which will be described later. For example, the first contact electrode CE1 may include copper (Cu). In some embodiments, the first contact electrode CE1 may be omitted.

Figure 3:
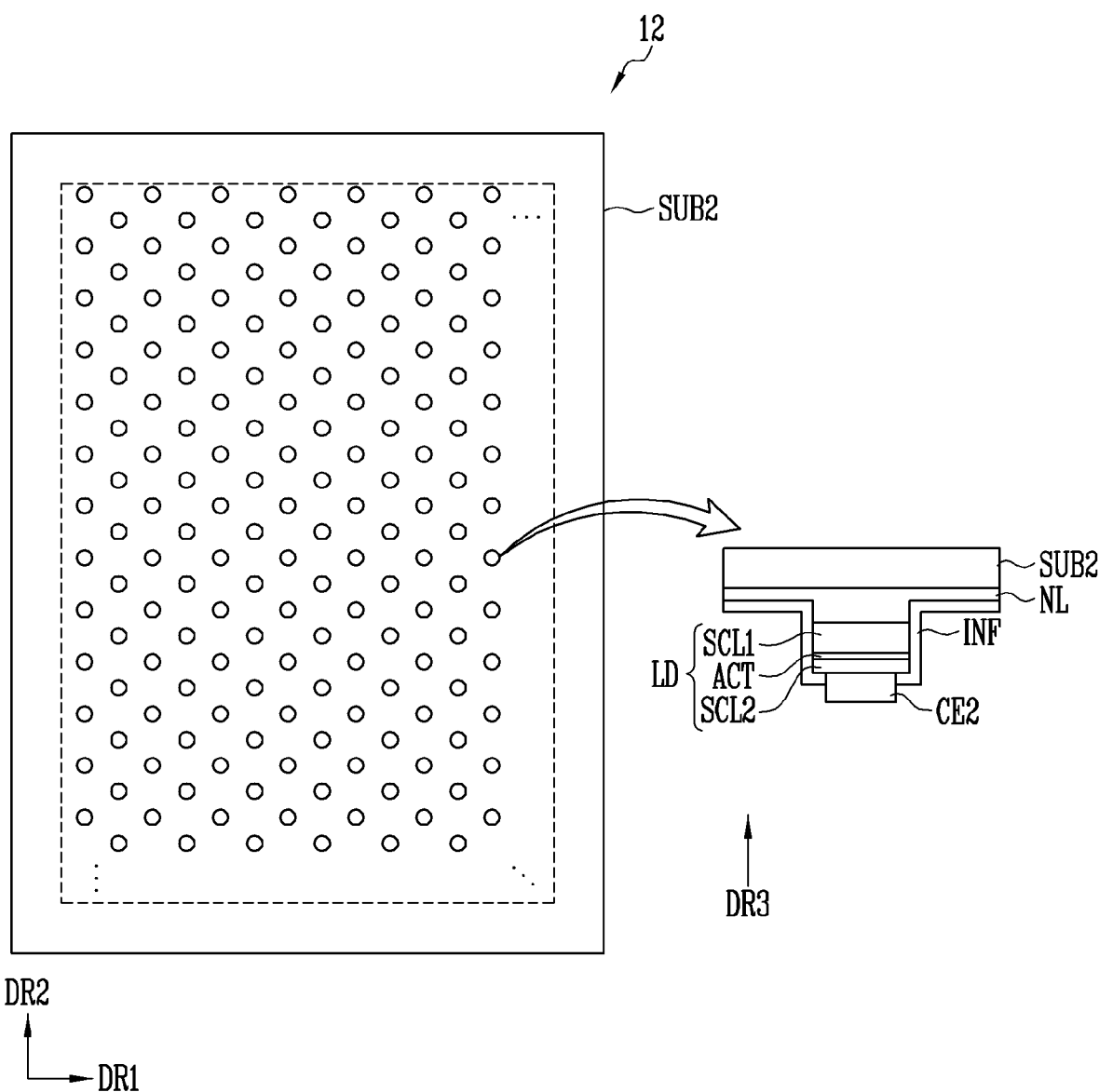
FIG. 3 is a diagram schematically illustrating an embodiment of a second panel used in the system shown in FIG. 1A.

FIG. 3 is a diagram schematically illustrating an embodiment of the second panel used in the system shown in FIG. 1A.

Referring to FIGS. 1A and 3, the second panel 12 may have various shapes. In an example, the second panel 12 may be provided in a rectangular plate shape, but the disclosure is not limited thereto. For example, similarly to the first panel 11, the second panel 12 may have a circular planar shape.

The second panel 12 may include a second substrate SUB2 and light emitting elements LD arranged on the bottom of the second substrate SUB2. The second substrate SUB2 may include at least one of silicon (Si), gallium nitride (GaN), gallium arsenide (GaAs), sapphire, and silicon carbide (SiC). For example, the second substrate SUB2 may be a sapphire substrate.

An intermediate layer NL (or nucleation layer) may be disposed between the second panel 12 and the light emitting element LD. The intermediate layer NL decreases a defect and deformation of the light emitting element LD in a process of manufacturing the light emitting element LD, and the second substrate SUB2 may be easily separated from the light emitting element LD by the intermediate layer NL. For example, the intermediate layer NL may include at least one semiconductor material among InAlGaN, GaN, AlGaN, InGaN, AlN, and InN, and may include an undoped semiconductor material. For example, the intermediate layer NL may include an undoped gallium nitride (GaN) semiconductor material. The intermediate layer NL may be commonly connected to second end portions of the light emitting elements LD, and constitute a second electrode. In some embodiments, a cathode electrode commonly connected to the second end portions of the light emitting elements LD may be further disposed between the intermediate layer NL and the light emitting elements LD.

The light emitting element LD may include a first semiconductor layer SCL1, a second semiconductor layer SCL2, and an active layer ACT interposed between the first and second semiconductor layers SCL1 and SCL2. In an example, the light emitting element LD may be implemented as a light emitting stack structure in which the second semiconductor layer SCL2, the active layer ACT, and the first semiconductor layer SCL1 may be sequentially stacked along the third direction DR3.

The light emitting element LD may be provided in a shape extending in a direction. In case assuming that the extending direction of the light emitting element LD is a length direction, the light emitting element LD may include a first end and a second end along the extending direction. In an embodiment, the length direction may be parallel to the third direction DR3. Any one of the first semiconductor layer SCL1 and the second semiconductor layer SCL2 may be located at the first end portion (or lower end portion) of the light emitting element LD, and the other of the first semiconductor layer SCL1 and the second semiconductor layer SCL2 may be located at the second end portion (or upper end portion) of the light emitting element LD. In an example, the second semiconductor layer SCL2 may be located at the first end portion (or lower end portion) of the light emitting element LD, and the first semiconductor layer SCL1 may be located at the second end portion (or upper end portion) of the light emitting element LD.

The light emitting element LD may be provided in various shapes. In an example, the light emitting element LD may have a rod-like shape or a bar-like shape, which may be long in its length direction (i.e., its aspect ratio may be greater than 1). The light emitting element LD may have a rod-like shape or a bar-like shape, which may be short in its length direction (i.e., its aspect ratio may be smaller than 1).

The above-described light emitting element LD may include, for example, a light emitting diode (LED) manufactured small enough to have a diameter and/or a length to a degree of nanometer scale or micrometer scale.

The size of the light emitting element LD may be variously changed to be suitable for requirements (or design conditions) of a lighting device or a self-luminescent display device, to which the light emitting element LD may be applied.

The second semiconductor layer SCL2 may include, for example, at least one p-type semiconductor layer. In an example, the second semiconductor layer SCL2 may include at least one semiconductor material among InAlGaN, GaN, AlGaN, InGaN, AlN, and InN, and include a p-type semiconductor layer doped with a second conductivity type dopant (or p-type dopant) such as Mg, Zn, Ca, Sr or Ba. However, the material constituting the second semiconductor layer SCL2 is not limited thereto. The second semiconductor layer SCL2 may be formed of various materials. In an embodiment, the second semiconductor layer SCL2 may include a gallium nitride (GaN) semiconductor material doped with a second conductivity type dopant (or p-type dopant). The second semiconductor layer SCL2 may include an upper surface in contact with the active layer ACT along the length direction of the light emitting element LD and a lower surface in contact with a second contact electrode CE2.

The active layer ACT may be disposed on the first semiconductor layer SCL1, and may be formed in a single-quantum well structure or a multi-quantum well structure. In an example, in case that the active layer ACT is formed in the multi-quantum well structure, a barrier layer (not shown), a strain reinforcing layer (not shown), and a well layer (not shown), which may constitute one unit, may be periodically and repeatedly stacked in the active layer ACT. The strain reinforcing layer may have a lattice constant smaller than that of the barrier layer, to further reinforce strain, e.g., compressive strain applied to the well layer. However, the structure of the active layer ACT is not limited to the above-described embodiment.

The active layer ACT may emit light having a wavelength of about 400 nm to about 900 nm, and use a double hetero structure. In an embodiment of the disclosure, a clad layer (not shown) doped with a conductivity type dopant may be formed on the top and/or the bottom of the active layer ACT along the length direction of the light emitting element LD. In an example, the clad layer may be formed as an AlGaN layer or InAlGaN layer. In some embodiments, a material such as AlGaN or AlInGaN may be used to form the active layer ACT. The active layer ACT may be configured with various materials. The active layer ACT may include a first surface in contact with the second semiconductor layer SCL2 and a second surface in contact with the first semiconductor layer SCL1.

In case that a corresponding signal (or voltage) is applied to each of the first end portion and the second end portion of the light emitting element LD, the light emitting element LD may emit light as electron-hole pairs may be recombined in the active layer ACT. The light emission of the light emitting element LD may be controlled by using such a principle, so that the light emitting element LD can be used as a light source (or light emitting source) for various light emitting devices, including a pixel of a display device.

The first semiconductor layer SCL1 may be disposed on the active layer ACT, and may include a semiconductor layer having a type different from that of the second semiconductor layer SCL2. In an example, the first semiconductor layer SCL1 may include at least one n-type semiconductor layer. For example, the first semiconductor layer SCL1 may include at least one semiconductor material among InAlGaN, GaN, AlGaN, InGaN, AlN, and InN, and be an n-type semiconductor layer doped with a first conductivity type dopant (or n-type dopant) such as Si, Ge, Sn, or a combination thereof. However, the material constituting the first semiconductor layer SCL1 is not limited thereto. The first semiconductor layer SCL1 may be configured with various materials. In an embodiment, the first semiconductor layer SCL1 may include a gallium nitride (GaN) semiconductor material doped with a first conductivity type dopant (or n-type dopant). The first semiconductor layer SCL1 may include a lower surface in contact with the active layer ACT along the length direction of the light emitting element LD and an upper surface facing the second substrate SUB2.

In an embodiment, the second semiconductor layer SCL2 and the first semiconductor layer SCL1 may have different thicknesses in the length direction of the light emitting element LD (or the third direction DR3). In an example, the first semiconductor layer SCL1 may have a thickness relatively thicker than that of the second semiconductor layer SCL2 along the length direction of the light emitting element LD (or the third direction DR3). Accordingly, the active layer ACT of the light emitting element LD may be located more adjacent to the lower surface of the second semiconductor layer SCL2 than the upper surface of the first semiconductor layer SCL1.

Although it is illustrated that each of the first semiconductor layer SCL1 and the second semiconductor layer SCL2 may be configured with one layer, the disclosure is not limited thereto. In an embodiment of the disclosure, each of the first semiconductor layer SCL1 and the second semiconductor layer SCL2 may further include at least one layer, e.g., a clad layer and/or a Tensile Strain Barrier Reducing (TSBR) layer according to the material of the active layer ACT. The TSBR layer may be a strain reducing layer disposed between semiconductor layers having different lattice structures to perform a buffering function for reducing a lattice constant difference. The TSBR layer may be configured with a p-type semiconductor layer such as p-GAlnP, p-AlInP or p-AlGaInP, but the disclosure is not limited thereto.

In some embodiments, the light emitting element LD may further include the second contact electrode CE2 disposed on the bottom of the second semiconductor layer SCL2, in addition to the first semiconductor layer SCL1, the active layer ACT, and the second semiconductor layer SCL2, which are described above. The second contact electrode CE2 may be a bonding metal coupled to the first electrode ELT1 (or pixel electrode) described with reference to FIG. 2. For example, the second contact electrode CE2 may include copper (Cu).

In an embodiment, the light emitting element LD may further include an insulative film INF. However, in some embodiments, the insulative film INF may be omitted, or be provided to cover only a portion of the light emitting stack structure.

The insulative film INF can prevent an electrical short circuit that may occur in case that the active layer ACT is in contact with a conductive material except the first semiconductor layer SCL1 and the second semiconductor layer SCL2. The insulative film INF may minimize a surface defect of the light emitting element LD, thereby improving the lifetime and light emission efficiency of the light emitting element LD. In case that light emitting elements LD are densely disposed, the insulative film INF can prevent an unwanted short circuit that may occur between the light emitting elements LD. Whether the insulative film INF may be provided is not limited as long as the active layer ACT can be prevented from being short-circuited with an external conductive material.

The insulative film INF may be provided in a shape entirely surrounding an outer circumferential surface of the light emitting stack structure including the second semiconductor layer SCL2, the active layer ACT, and the first semiconductor layer SCL1.

In the above-described embodiment, it has been described that the insulative film INF may be provided in a shape entirely surrounding an outer circumferential surface of each of the second semiconductor layer SCL2, the active layer ACT, and the first semiconductor layer SCL1. However, the disclosure is not limited thereto. In some embodiments, in case that the light emitting element LD includes the second contact electrode CE2, the insulative film INF may entirely surround an outer circumferential surface of each of the second contact electrode CE2, the second semiconductor layer SCL2, the active layer ACT, and the first semiconductor layer SCL1. In other embodiments, the insulative film INF may not entirely surround the outer circumferential surface of the second contact electrode CE2. In other embodiments, the insulative film INF may surround only a portion of the outer circumferential surface of the second contact electrode CE2, and may not surround the other of the outer circumferential surface of the second contact electrode CE2. The insulative film INF may expose at least one area of the second contact electrode CE2.

The insulative film INF may include a transparent insulating material. For example, the insulative film INF may include at least one insulating material selected from the group of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium-strontium oxide ($SrTiO_x$), cobalt oxide ($Co_xO_y$), magnesium oxide (MgO), zinc oxide ($ZnO_x$), ruthenium oxide ($RuO_x$), nickel oxide (NiO), tungsten oxide ($WO_x$), tantalum oxide ($TnO_x$), gadolinium oxide ($GdO_x$), zirconium oxide ($ZrO_x$), gallium oxide (GaO$_x$), vanadium oxide (V$_x$O$_y$), ZnO:Al, ZnO:B, In$_x$O$_y$:H, niobium oxide (Nb$_x$O$_y$), magnesium fluoride (MgF$_x$), aluminum fluoride (AlF$_x$), Alucone polymer film, titanium nitride (TiN), tantalum nitride (TaN), aluminum nitride (AlNx), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the disclosure is not limited thereto, and various materials having insulating properties may be used as the material of the insulative film INF.

The insulative film INF may be provided in the form of a single layer or be provided in the form of a multi-layer including at least two layers. In an example, in case that the insulative film INF may be configured as a double layer including a first layer and a second layer, which may be sequentially stacked, the first layer and the second layer may be made of different materials (or ingredients), and be formed through different processes. In some embodiments, the first layer and the second layers may include the same material.

The above-described light emitting element LD may be used as a light emitting source (or light source) of various display devices.

Figure 4:
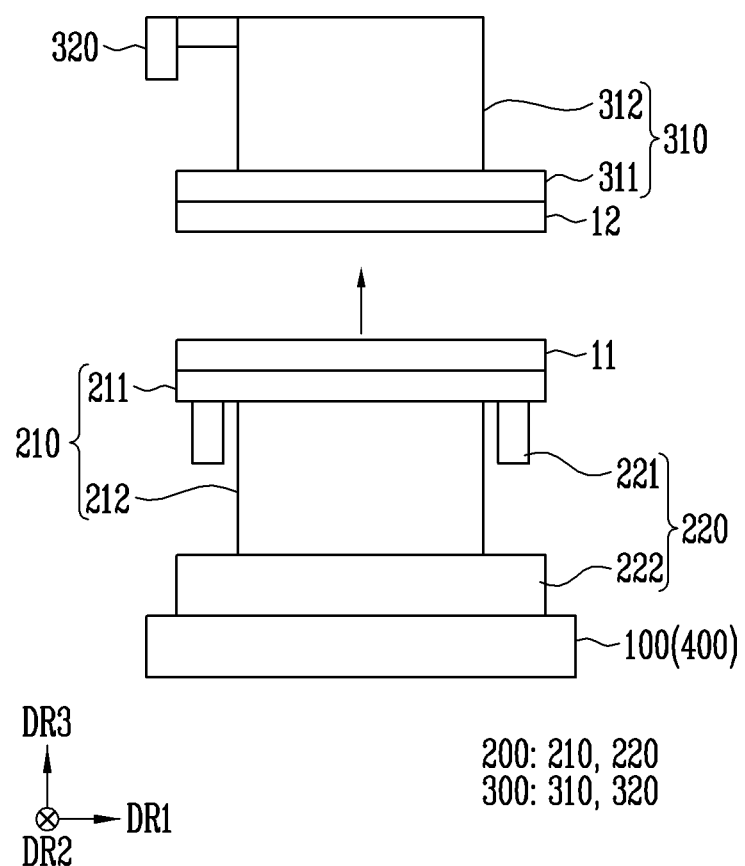
FIG. 4 is a diagram schematically illustrating an embodiment of an alignment apparatus and a bonding apparatus, which may be included in the system shown in FIG. 1A.
Figure 5:
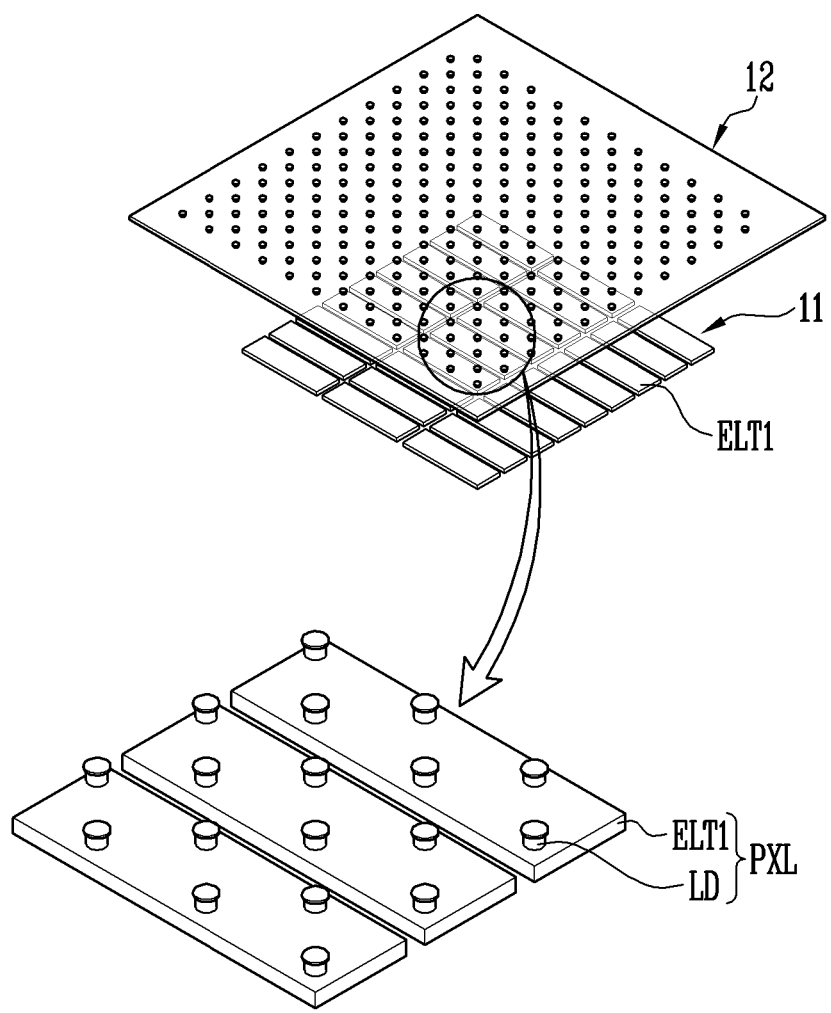
FIG. 5 is a diagram schematically illustrating an operation of the alignment apparatus included in the system shown in FIG. 1A.
Figure 6:
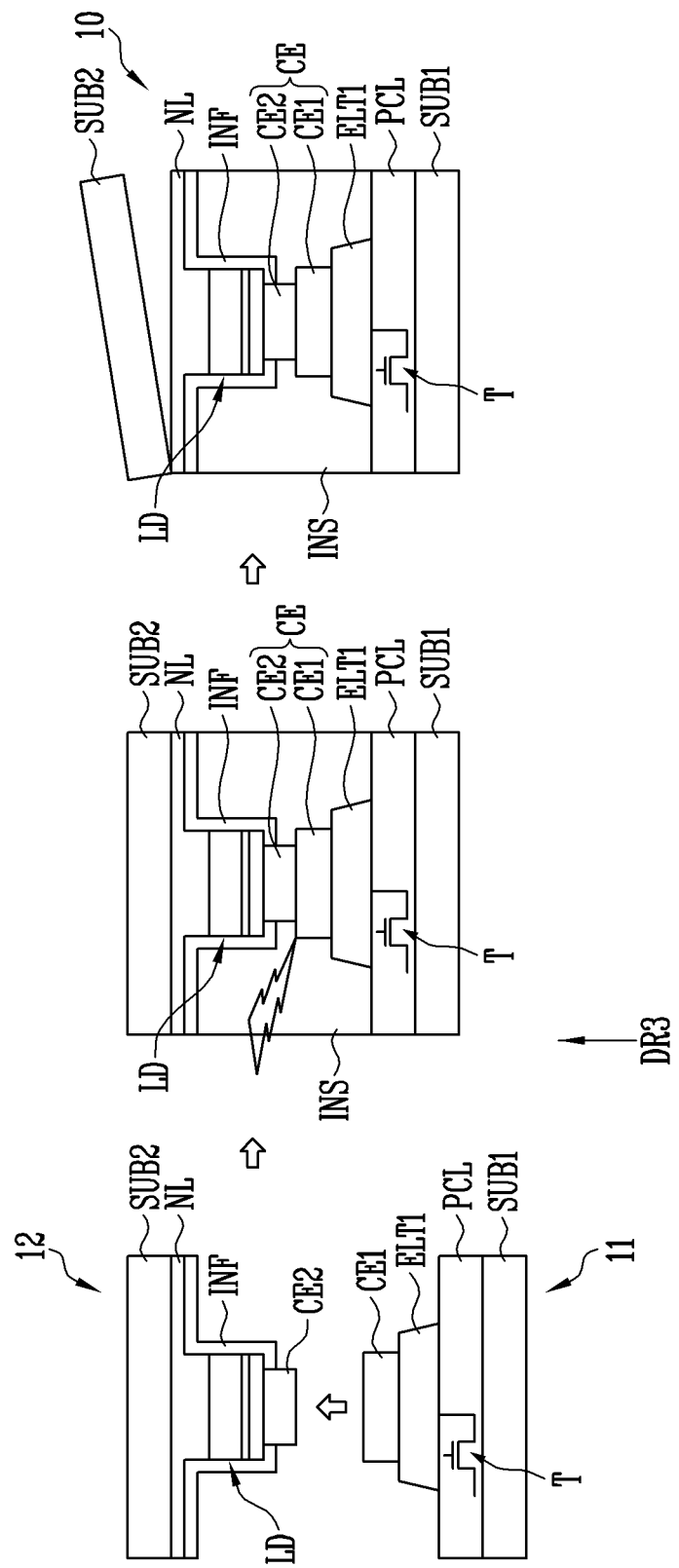
FIG. 6 is a diagram schematically illustrating an operation of the bonding apparatus included in the system shown in FIG. 1A.

FIG. 4 is a diagram schematically illustrating an embodiment of the alignment apparatus and the bonding apparatus, which may be included in the system shown in FIG. 1A. FIG. 5 is a diagram schematically illustrating an operation of the alignment apparatus included in the system shown in FIG. 1A. FIG. 6 is a diagram schematically illustrating an operation of the bonding apparatus included in the system shown in FIG. 1A. In FIG. 6, a bonding process is briefly illustrated based on one light emitting element LD.

Referring to FIGS. 1A, 1B, and 4 to 6, the alignment apparatus 200 may include a first panel supporting part 210 and a position control part 220.

The first panel supporting part 210 may support or fix the first panel 11. For example, the first panel supporting part 210 may include a first plate 211 (or first stage) and a first plate driving unit 212. The first panel 11 may be mounted on a surface of the first plate 211, and the first plate driving unit 212 may fix the first panel 11 onto the first plate 211. For example, the first plate driving unit 212 may fix the first panel 11 onto the first plate 211 by using a vacuum absorption technique.

The position control part 220 may accurately control the position of the first panel 11 with respect to the second panel 12. For example, the position control part 220 may include a sensing unit 221 and an adjustment unit 222 (or calibration unit). The sensing unit 221 may be disposed on the bottom of the first plate 211, but the disclosure is not limited thereto. For example, the sensing unit 221 may be disposed on a side surface of the first plate driving unit 212.

For example, the sensing unit 221 may be implemented as an image photographing device as a camera. The sensing unit 221 may generate a sensing image by photographing the first alignment mark included in the first panel 11 and/or the second alignment mark included in the second panel 12, and the adjustment unit 222 may control a position of the first panel 11 on a first plane, based on the sensing image. The first plane may be a plane defined by the first direction DR1 and the second direction DR2. As shown in FIG. 5, the alignment apparatus 200 may control the position of the first panel 11 with respect to the second panel 12 such that a number of light emitting elements LD may be disposed on a first electrode ELT1 which may be included in the first panel 11 and may constitute one pixel PXL. The adjustment unit 222 may include a motor, etc.

For example, the sensing unit 221 may be implemented as a position sensor. The sensing unit 221 may measure a position of the first panel 11 with respect to the second panel 12, and the adjustment unit 222 may control the position of the first panel 11 in the third direction DR3, based on information on the measured position. As shown in FIG. 6, the adjustment unit 222 may allow the first contact electrode CE1 of the first panel 11 to be in contact with the second contact electrode CE2 of the second panel 12 by moving the first panel 11 in the third direction DR3.

The bonding apparatus 300 may include a second panel supporting part 310 and a laser irradiation part 320.

Similarly to the first panel supporting part 210, the second panel supporting part 310 may support or fix the second panel 12. For example, the second panel supporting part 310 may include a second plate 311 (or second stage) and a second plate driving unit 312. The second panel 12 may be mounted on a surface of the second plate 311, and the second plate driving unit 312 may fix the second panel 12 onto the second plate 311. For example, the second plate driving unit 312 may fix the second panel 12 onto the second plate 311 by using the vacuum absorption technique.

The laser irradiation part 320 may irradiate laser light onto an area in which the first panel 11 and the second panel 12 may be in contact with each other. For example, the laser irradiation part 320 may include a laser generator for generating laser light, an optical system, etc.

As shown in FIG. 6, the laser irradiation part 320 may irradiate laser light onto an area in which the first contact electrode CE1 and the second contact electrode CE2 may be in contact with each other, or the first contact electrode CE1 and the second contact electrode CE2. For example, the laser irradiation part 320 may irradiate laser light onto an insulating layer INS disposed between the first panel 11 and the second panel 12. The insulating layer INS may include an insulating material including an inorganic material and/or an organic material.

The first contact electrode CE1 and the second contact electrode CE2 may be fused by the laser light to be coupled to each other. For example, the light emitting element LD may be bonded onto the first electrode ELT1 by the contact electrode CE. The light emitting element LD may be electrically connected to the first electrode ELT1 through the contact electrode CE.

In an embodiment, the laser irradiation part 320 may irradiate laser light onto the second substrate SUB2 (and the intermediate layer NL). The intermediate layer NL may be decomposed by absorbing the laser light. For example, in case that the intermediate layer NL includes gallium nitride (GaN), the gallium nitride (GaN) absorbing the laser light may be decomposed into gallium (Ga) and nitrogen (N$_2$), and the second substrate SUB2 may be separated from the light emitting element LD due to evaporation of the nitrogen (N$_2$).

Figure 7:
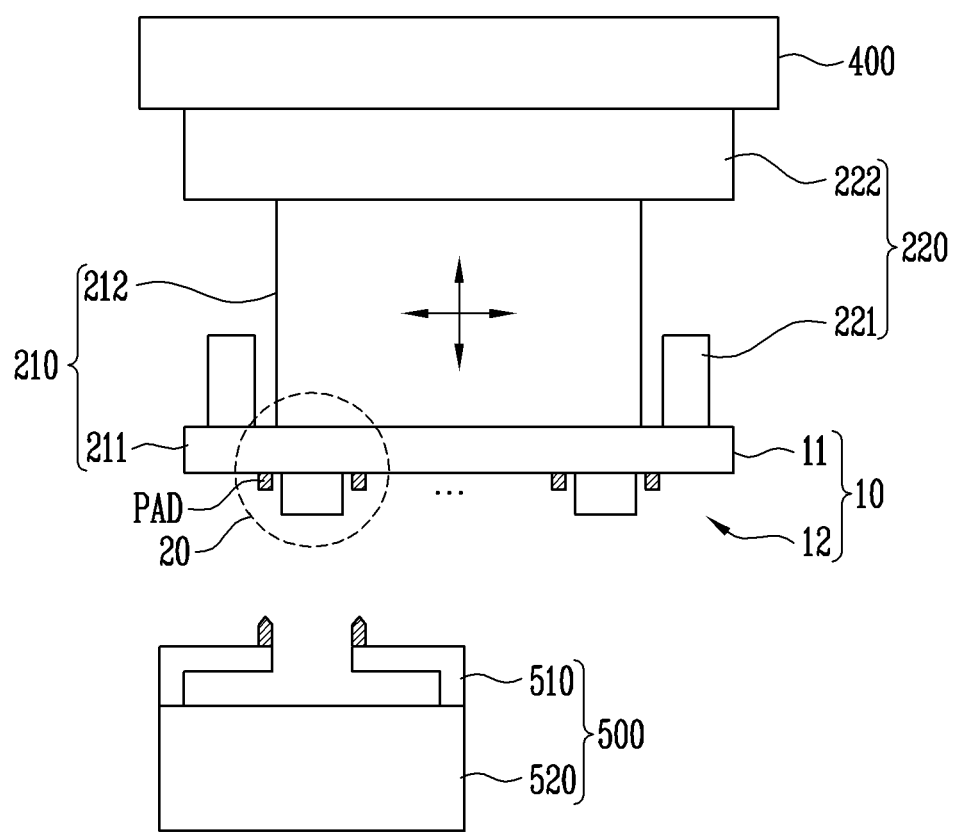
FIG. 7 is a diagram schematically illustrating an embodiment of a test apparatus included in the system shown in FIG. 1A.

FIG. 7 is a diagram schematically illustrating an embodiment of the test apparatus included in the system shown in FIG. 1A.

Referring to FIGS. 1A, 1, 4, and 7, the alignment apparatus 200 may be disposed to face downwardly by the rotating apparatus 400. In other words, the mother panel 10 may be overturned by using the rotating apparatus 400, to face the test apparatus 500.

The mother panel 10 may include pads PAD formed on the first panel 11. The pads PAD may be located at an edge in the second direction DR2 with respect to one display panel 20, but the positions of the pads PAD are not limited thereto.

The position control part 220 may control the position of the mother panel 10 (or the first panel 11) with respect to the test apparatus 500.

For example, the sensing unit 221 may generate a sensing image by photographing the mother panel 10 and the test apparatus 500, and the adjustment unit 222 may control the position of the mother panel 10 on the first plane, based on the sensing image. For example, the adjustment unit 222 may control the position of the mother panel 10 such that the pads PAD of the mother panel 10 may be located while corresponding to probe pins of the test apparatus 500.

For example, the sensing unit 221 may measure a position of the mother panel 10 with respect to the test apparatus 500, and the adjustment unit 222 may control the position of the mother panel 10 in the third direction DR3, based on information on the measured position. For example, the adjustment unit 222 may allow the pads PAD of the mother panel 10 to be in contact with the probe pins of the test apparatus 500 by moving the mother panel 10 in the opposite direction of the third direction DR3.

The test apparatus 500 may apply an electrical signal (e.g., a test voltage) to the pads PAD of the mother panel 10, and sense a sensing signal from the mother panel 10 (or the display panel 20) in response to the electrical signal (e.g., a current flowing into the display panel 20 in response to the test voltage).

The test apparatus 500 may include a probe block 510 and a probe unit 520. The probe block 510 may include probe pins and a probe body supporting the probe pins. The probe unit 520 (or a circuit unit) may apply an electrical signal by applying power to the probe block 510, and sense a signal corresponding to the electrical signal.

In an embodiment, the test apparatus 500 may sequentially perform a lighting test on multiple display panels 20 included in the mother panel 10. The alignment apparatus 200 may control movement of the mother panel 10 such that the display panels 20 may be sequentially in contact with the test apparatus 500 (or the probe pins). For example, the alignment apparatus 200 may align a first display panel (e.g., a leftmost display panel) among the display panels 20 with the test apparatus 500 (or the probe pins), and allow pads PAD of the first display panel to be in contact with the test apparatus 500 (or the probe pins) by moving the mother panel 10 in the third direction DR3. After the lighting test on the first display panel may be completed, the alignment apparatus 200 may align a second display panel (e.g., a rightmost display panel) among the display panels 20 with the test apparatus 500 (or the probe pins), and allow pads PAD of the second display panel to be in contact with the test apparatus 500 (or the probe pins) by moving the mother panel 10 in the third direction DR3.

A lighting test on a display panel 20 will be described with reference to FIGS. 8 and 9.

Figure 8:
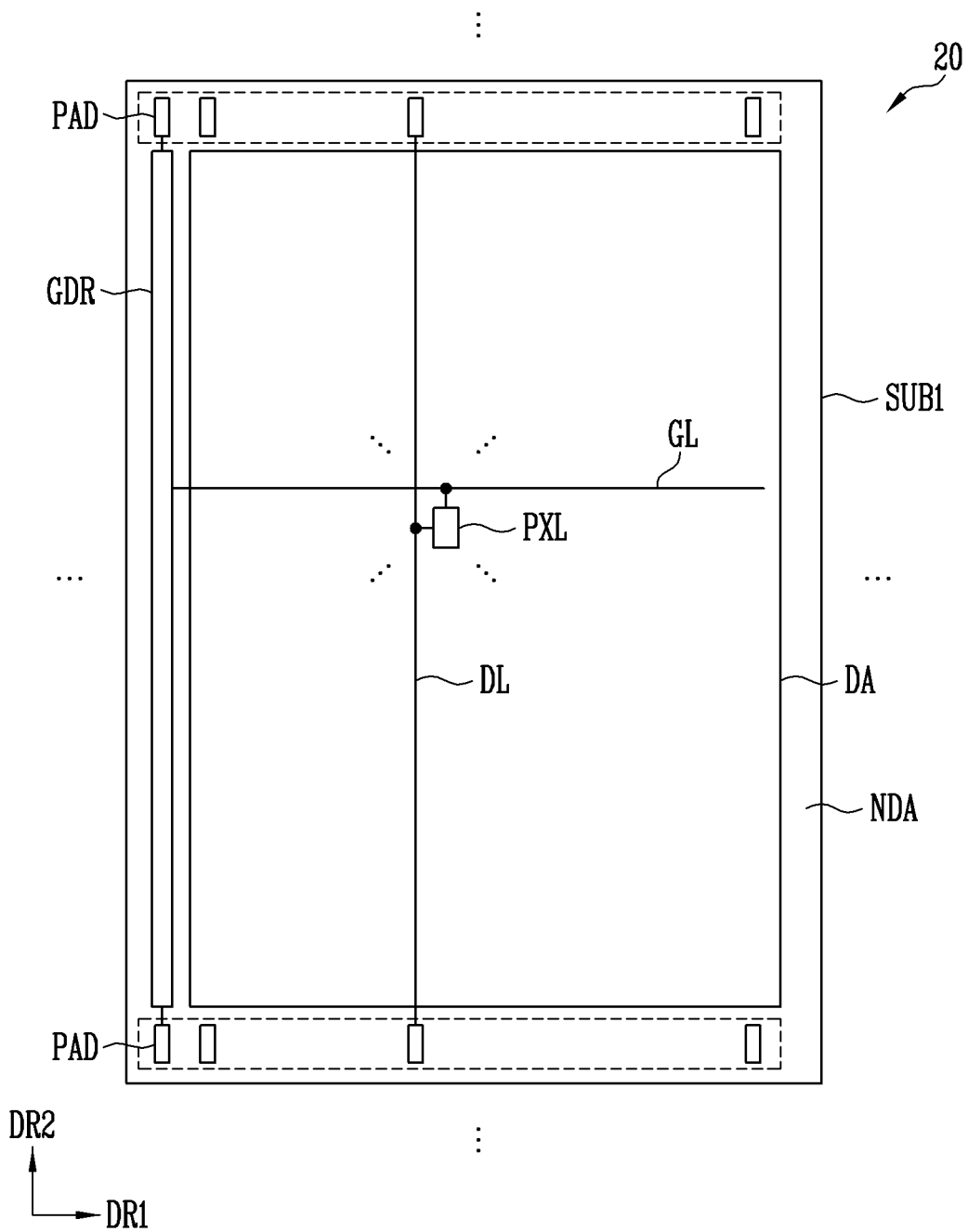
FIG. 8 is a diagram schematically illustrating an embodiment of a display panel included in a mother panel manufactured in the system shown in FIG. 1A.

FIG. 8 is a diagram schematically illustrating an embodiment of a display panel included in a mother panel manufactured in the system shown in FIG. 1A. FIG. 9 is a diagram schematically illustrating an embodiment of a pixel included in the display panel shown in FIG. 8.

The display panel 20 may include a first substrate SUB1 and pixels PXL provided on the first substrate SUB1.

The first substrate SUB1 (or the display panel 20) may include a display area DA and a non-display area NDA. The display area DA may be an area in which the pixels PXL may be provided to display an image. The non-display area NDA may be an area in which the pixels PXL may not be provided, and may be an area in which the image may not be displayed.

The pixels PXL may be provided in the display area DA of the first substrate SUB1. Each of the pixels PXL may be a minimum unit which displays an image. Each of the pixels PXL may include a light emitting element emitting white light and/or colored light. Each of the pixels PXL may emit light of any color among red, green, and blue. However, the disclosure is not limited thereto, and each of the pixels PXL may emit light of a color such as cyan, magenta or yellow.

The pixels PXL may be arranged in a matrix form along rows extending in the first direction DR1 and columns extending in the second direction DR2 intersecting the first direction DR1. However, the arrangement form of the pixels PXL is not particularly limited, and the pixels PXL may be arranged in various forms. In the drawings, it is illustrated that the pixels PXL may have a rectangular shape. However, the disclosure is not limited thereto, and the pixels PXL may be modified in various shapes. In case that pixels PXL are provided, the pixels PXL may be provided to different areas (or in different sizes). For example, in case that pixels PXL having different colors of lights emitted therefrom are provided, the pixels PXL may be provided to have different areas (or sizes) or different shapes with respect to the colors.

A driver for driving the pixels PXL, some of lines connecting the pixels PXL and the driver, and pads PAD connected to some of the lines may be provided in the non-display area NDA. The non-display area NDA may correspond to a bezel area of the display panel 20.

The pads PAD may be provided in the non-display area NDA located in the second direction DR2 and the opposite direction of the second direction DR2 with respect to the display area DA, but the disclosure is not limited thereto. For example, the pads PAD may be provided in only the non-display area NDA located in the second direction DR2 with respect to the display area DA. Some of the pads PAD may be connected to the pixels PXL through data lines DL.

A gate driver GDR may be provided in the non-display area NDA, and may be connected to others of the pads PAD. The gate driver GDR may be connected to the pixels PXL through gate lines GL. The gate driver GDR may sequentially generate a gate signal, based on a gate control signal (e.g., a start signal and clock signals) provided through the others of the pads PAD, and sequentially provide the gate signal to the gate lines GL along the second direction DR2 (or scan direction).

Figure 9:
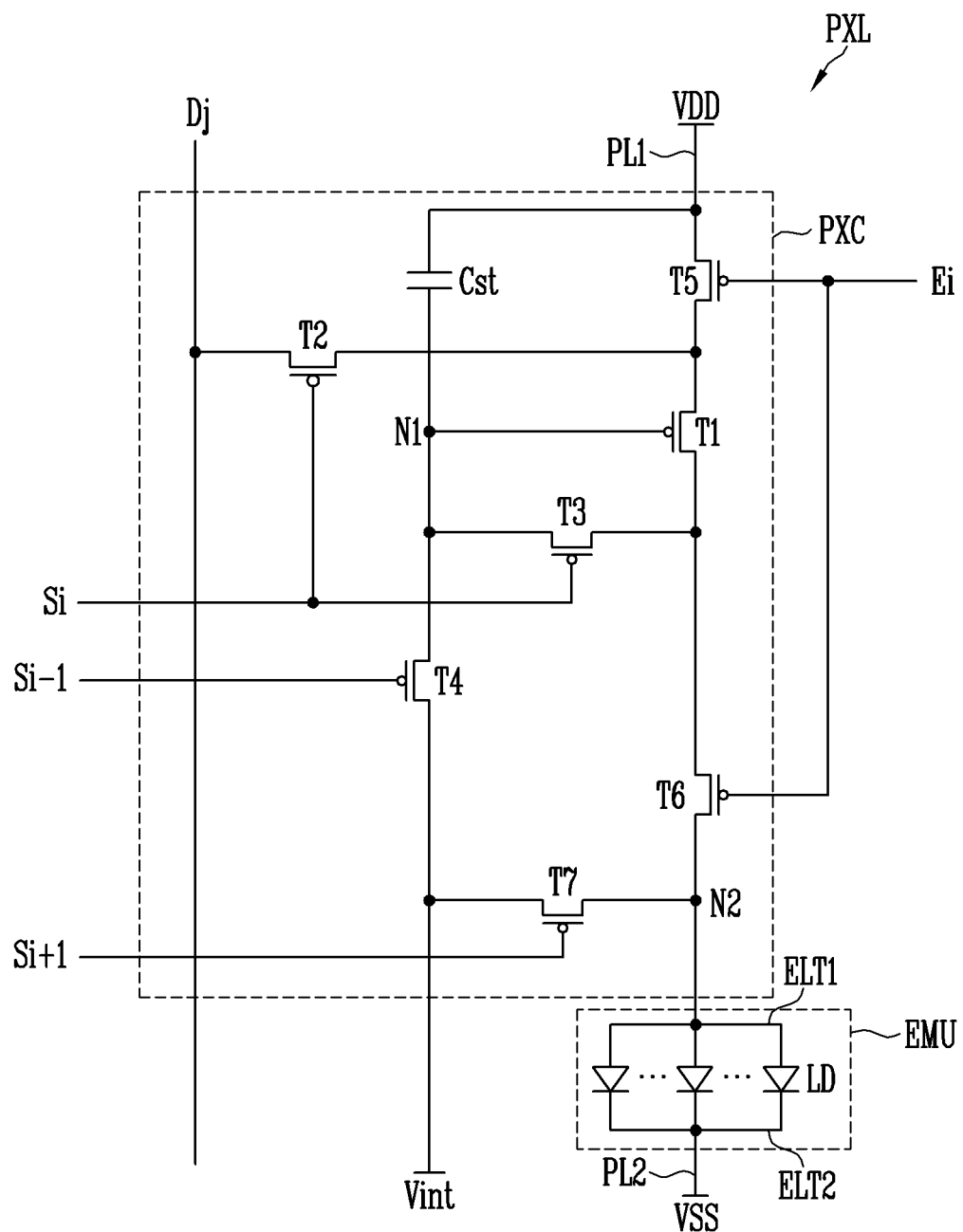
FIG. 9 is a diagram schematically illustrating an embodiment of a pixel included in the display panel shown in FIG. 8.

Referring to FIG. 9, one pixel PXL may include a light emitting unit EMU which generates light with a luminance corresponding to a data signal. The pixel PXL may selectively further include a pixel driving circuit PXC (or pixel circuit) for driving the light emitting unit EMU.

In some embodiments, the light emitting unit EMU may include at least one light emitting element LD connected in parallel between a first power line PL1 to which a voltage of a first driving power source VDD may be applied and a second power line PL2 to which a voltage of a second driving power source VSS may be applied. For example, the light emitting unit EMU may include a first electrode ELT1 electrically connected to the first driving power source VDD via the pixel driving circuit PXC and the first power line PL1, a second electrode ELT2 electrically connected to the second driving power source VSS through the second power line PL2, and light emitting elements LD connected in parallel to each other in the same direction between the first and second electrodes ELT1 and ELT2. In an embodiment, the first electrode ELT1 may be an anode electrode, and the second electrode ELT2 may be a cathode electrode.

In an embodiment, each of the light emitting elements LD included in the light emitting unit EMU may include a first end portion connected to the first driving power source VDD through the first electrode ELT1 and a second end portion connected to the second driving power source VSS through the second electrode ELT2. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set equal to or higher than a threshold voltage of the light emitting elements LD during an emission period of the pixel PXL.

As described above, the light emitting elements LD connected in parallel in the same direction (e.g., a forward direction) between the first electrode ELT1 and the second electrode ELT2, to which voltages having difference potentials may be supplied, may form effective light sources, respectively. These effective light sources may constitute the light emitting unit EMU of the pixel PXL.

The light emitting element LD of the light emitting unit EMU may emit light with a luminance corresponding to a driving current supplied through a corresponding pixel driving circuit PXC. For example, the pixel driving circuit PXC may supply, to the light emitting unit EMU, a driving current corresponding to a grayscale value of corresponding frame data during each frame period. The driving current supplied to the light emitting unit EMU may be divided to flow through the light emitting elements LD. Accordingly, the light emitting unit EMU can emit light with a luminance corresponding to the driving current while each light emitting element LD emits light with a luminance corresponding to a current flowing therethrough.

The pixel driving circuit PXC may be connected to a gate line GL (see FIG. 8) and a data line DL (see FIG. 8) of the pixel PXL. In an example, in case that the pixel PXL is disposed on an ith row and a jth column of the display area DA (see FIG. 8), the pixel driving circuit PXC of the corresponding pixel PXL may be connected to an ith scan line Si and a jth data line Dj of the display area DA. The ith scan line Si may be included in the gate line GL.

In some embodiments, the pixel driving circuit PXC may be further connected to at least another scan line. For example, the pixel PXL disposed on the ith row of the display area DA may be further connected to an (i−1)th scan line Si−1 and/or an (i+1)th scan line Si+1. The (i−1)th scan line Si−1 and the (i+1)th scan line Si+1 may be included in the gate line GL.

In some embodiments, the pixel driving circuit PXC may be further connected to a third power source in addition to the first and second driving power sources VDD and VSS. For example, the pixel driving circuit PXC may be connected to an initialization power source Vint.

The pixel driving circuit PXC may include first to seventh transistors T1 to T7 and a storage capacitor Cst.

A first terminal, e.g., a source electrode of the first transistor T1 (driving transistor) may be connected to the first driving power source VDD via the fifth transistor T5, and a second terminal, e.g., a drain electrode of the first transistor T1 may be connected to one end portion of each of the light emitting element LD via the sixth transistor T6. A gate electrode of the first transistor T1 may be connected to a first node N1. The first transistor T1 may control a driving current flowing between the first driving power source VDD and the second driving power source VSS via the light emitting elements LD, corresponding to a voltage of the first node N1.

The second transistor T2 (switching transistor) may be connected between the jth data line Dj connected to the pixel PXL and the source electrode of the first transistor T1. A gate electrode of the second transistor T2 may be connected to the ith scan line Si connected to the pixel PXL. The second transistor T2 may be turned on in case that a scan signal having a gate-on voltage (e.g., a low voltage) may be supplied from the ith scan line Si, to electrically connect the jth data line Dj to the source electrode of the first transistor T1. Therefore, in case that the second transistor T2 is turned on, a data signal supplied from the jth data line Dj may be transferred to the first transistor T1.

The third transistor T3 may be connected between the drain electrode of the first transistor T1 and the first node N1. A gate electrode of the third transistor T3 may be connected to the ith scan line Si. The third transistor T3 may be turned on in case that the scan signal having the gate-on voltage is supplied from the ith scan line Si, to electrically connect the drain electrode of the first transistor T1 and the first node N1 to each other.

The fourth transistor T4 may be connected between the first node N1 and an initialization power line to which the initialization power source Vint is connected. A gate electrode of the fourth transistor T4 may be connected to a previous scan line, e.g., the (i−1)th scan line Si−1. The fourth transistor T4 may be turned on in case that the scan signal having the gate-on voltage is supplied from the (i−1)th scan line Si−1, to transfer a voltage of the initialization power source Vint to the first node N1. The initialization power source Vint may have a voltage level lower than a lowest voltage level of the data signal.

The fifth transistor T5 may be connected between the first driving power source VDD and the first transistor T1. A gate electrode of the fifth transistor T5 may be connected to a corresponding emission control line, e.g., an ith emission control line Ei. The ith emission control line Ei may be included in the gate line GL (see FIG. 8). The sixth transistor T6 may be connected between the first transistor T1 and one end portion of each of the light emitting elements LD (or a second node N2). A gate electrode of the sixth transistor T6 may be connected to an ith emission control line Ei. The fifth and sixth transistors T5 and T6 may be turned off in case that an emission control signal having a gate-off voltage is supplied to the ith emission control line Ei, and be turned on in other cases.

The seventh transistor T7 may be connected between one end portion of each of the light emitting elements LD and the initialization power line. A gate electrode of the seventh transistor T7 may be connected to any one of scan lines of a next stage, e.g., the (i+1)th scan line Si+1. The seventh transistor T7 may be turned on in case that the scan signal having the gate-on voltage is supplied to the (i+1)th scan line Si+1, to supply the voltage of the initialization power source Vint to the one end portion of each of the light emitting elements LD.

The storage capacitor Cst may be connected between the first driving power source VDD and the first node N1. The storage capacitor Cst may store a voltage corresponding to the data signal supplied to the first node N1 in each frame period and a threshold voltage of the first transistor T1.

Although the transistors, e.g., the first to seventh transistors T1 to T7 that may be included in the pixel driving circuit PXC are all illustrated as P-type transistors in FIG. 9, the disclosure is not limited thereto. For example, at least one of the first to seventh transistors T1 to T7 may be changed to an N-type transistor.

The test apparatus 500 (see FIG. 7) may test whether the light emitting unit EMU (or the light emitting element LD) normally emits light through a path from the initialization power source Vint to the second driving power source VSS via the seventh transistor T7 and the light emitting unit EMU. For example, the test apparatus 500 may apply an electrical signal (e.g., a test voltage) to a pad PAD connected to the initialization power source Vint and a pad PAD connected to the second driving power source VSS. The test apparatus 500 may provide a start signal and clock signals through a pad PAD connected to the gate driver GDR (see FIG. 8) such that the gate driver GDR supplies the scan signal having the gate-on voltage to the (i+1)th scan line Si+1. The test apparatus 500 may measure a current flowing through the light emitting unit EMU through the path, i.e., a current flowing out through the pad PAD connected to the initialization power source Vint or a current flowing in through the pad PAD connected to the second driving power source VSS, and compare the measured current with a reference current (e.g., a current corresponding to the test voltage). In case that the measured current (or a waveform of the measured current) is similar to the reference current (or a waveform of the reference current), it may be determined that the corresponding pixel PXL normally emits light.

The test apparatus 500 may sequentially supply the scan signal to the rows (or pixel rows) of the display area DA (see FIG. 8), to determine whether pixels PXL normally emit light for each row and to determine whether the display panel 20 normally lights. The test apparatus 500 may sequentially perform a lighting test on display panels 20 in the above-described manner. Accordingly, the test apparatus 500 may acquire a result of the lighting test.

In an embodiment, the test apparatus 500 may generate a defect management map, based on the result of the lighting test.

FIG. 10 is a diagram schematically illustrating an embodiment of the defect management map generated in the test apparatus included in the system shown in FIG. 1A.

Referring to FIGS. 1A, 2, and 7 to 10, the defect management map may include position information of display panels 20 and test result information set corresponding thereto. For example, the position information may be expressed as XY coordinates, based on an arrangement order of the display panels 20 shown in FIG. 2 in the first direction DR1 and an arrangement order of the display panels 20 in the second direction DR2. The test result information may include a code value associated with a lighting test result of a corresponding display panel 20 or a defect type occurring in the corresponding display panel 20. For example, a code value of 1 (or a first code value) may represent that all light emitting elements LD in the display panel 20 normally emit light (i.e., normal lighting), and a code value of 76 (or a second code value) may represent that all the light emitting elements LD in the display panel 20 abnormally emit light or emit no light (i.e., abnormal lighting). For example, the code value of 73, which may be set corresponding to position information of (9, 9), may represent that some of the light emitting elements LD in the display panel 20 emit no light (i.e., partial abnormal lighting). For example, a defect of the display panel 20 may be managed through the defect management map. The cutting apparatus 600 described with reference to FIG. 1C may perform a cutting process on only display panels 20 which may be good products, (e.g., display panels 20 in which the code value of 1 may be set), based on the defect management map.

As described above, the test apparatus 500 can generate a defect management map representing whether each of the display panels 20 included in the mother panel 10 may be a good product (or a defect type occurring in each of the display panels 20) by performing a lighting test on the mother panel 10. Thus, manufacturing processes of the display device can be simplified, as compared with a method of individually performing a lighting test on each of multiple display panels after a separation process of the display panels.

In case that the lighting test is sequentially performed on the display panels 20 included in the mother panel 10, the test apparatus 500 may be not moved, but the mother panel 10 can be moved by using the alignment apparatus 200. Since an alignment process may be performed by using an alignment apparatus 200 in a bonding process and a test process, i.e., since an alignment unit used in the bonding process and an alignment unit used in the test process may be implemented as one alignment apparatus 200, the system 1000 can be simplified.

Figure 11:
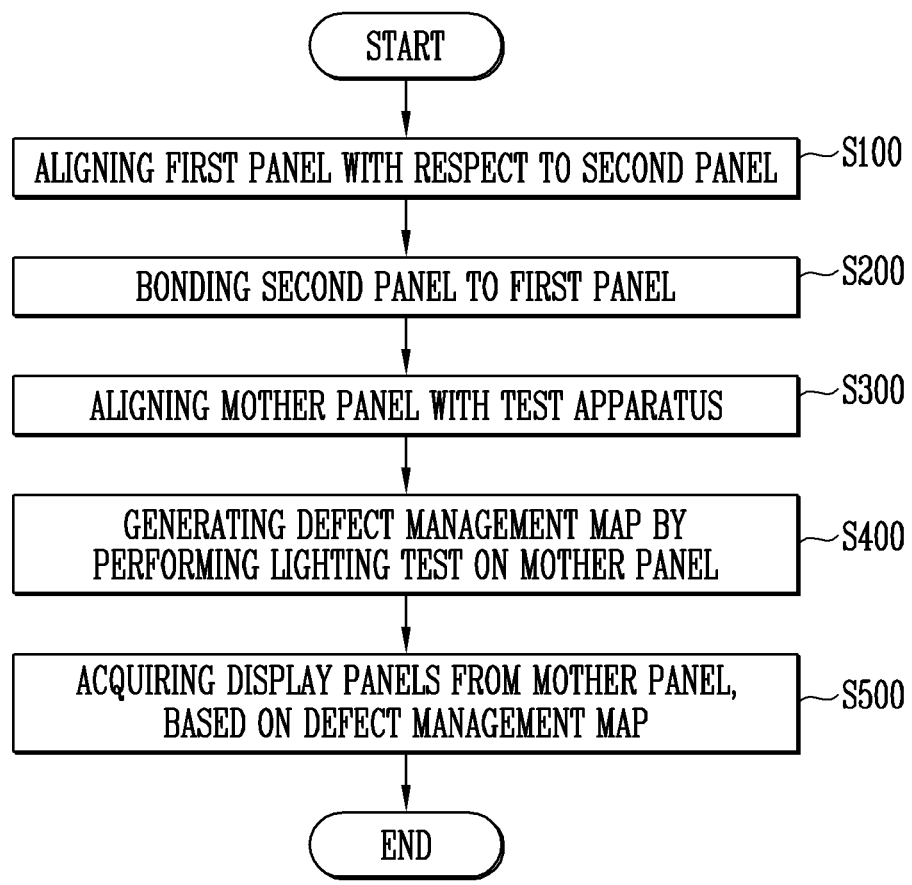
FIG. 11 is a flowchart schematically illustrating a method of manufacturing a display device in accordance with embodiments of the disclosure.

FIG. 11 is a flowchart schematically illustrating a method of manufacturing a display device in accordance with embodiments of the disclosure.

Referring to FIGS. 1A to 1C and 11, the method shown in FIG. 11 may be performed in the system 1000 shown in FIGS. 1A to 1C.

The method shown in FIG. 11 may align the first panel 11 and the second panel 12 by using the alignment apparatus 200 (S100).

As described with reference to FIG. 2, the first panel 11 may include the pixel driving circuits arranged on the first substrate SUB1, and each of the pixel driving circuits may include the transistor T and the first electrode ELT1 (or pixel electrode) connected to the transistor T. As described with reference to FIG. 3, the second panel 12 may include the light emitting elements LD arranged on a surface (e.g., a bottom surface) of the second substrate SUB2.

As described with reference to FIG. 4, the alignment apparatus 200 may support or fix the first panel 11 through a first panel supporting part 210, and adjust a position of the first panel 11 with respect to the second panel 12 on the first plane through the position control part 220. The first plane may be defined by the first direction DR1 and the second direction DR2. As described with reference to FIG. 6, the alignment apparatus 200 may move the first panel 11 toward the second panel 12 (i.e., in the third direction DR3) such that the first electrode ELT1 (or first contact electrode CE1) of the first panel 11 may be in contact with the light emitting element LD (or second contact electrode CE2) of the second panel 12.

Subsequently, the method shown in FIG. 11 may couple or bond the second panel 12 to the first panel 11 by using the bonding apparatus 300 (S200). As described with reference to FIGS. 4 and 6, the bonding apparatus 300 may irradiate laser light onto or apply heat to the first contact electrode CE1 and/or the second contact electrode CE2, or an area between one end portion of the light emitting element LD, which may be in contact with the first contact electrode CE1, and the first electrode ELT1 (or pixel electrode). The first contact electrode CE1 and/or the second contact electrode CE2 may be fused such that the light emitting element LD may be bonded or electrically connected to the first electrode ELT1.

The method shown in FIG. 11 may separate the second substrate SUB2 from the mother panel 10 by irradiating laser light onto the second substrate SUB2 (or the intermediate layer NL between the second substrate SUB2 and the light emitting element LD). As described with reference to FIG. 6, in case that the intermediate layer NL includes gallium nitride (GaN), the gallium nitride (GaN) absorbing the laser light may be decomposed into gallium (Ga) and nitrogen ($N_2$), and the second substrate SUB2 may be separated from the light emitting element LD by evaporation of the nitrogen ($N_2$).

Subsequently, the method shown in FIG. 11 may align the mother panel 10 with the test apparatus 500 (S300).

As described with reference to FIG. 7, the method shown in FIG. 11 may adjust a position of the mother panel 10 with respect to the test apparatus 500 by using the alignment apparatus 200. The method shown in FIG. 11 may move the mother panel 10 toward the test apparatus 500 by using the alignment apparatus 200 such that the probe pin of the test apparatus 500 may be in contact with the pad PAD provided in the mother panel 10 (or the display panel 20).

In an embodiment, the method shown in FIG. 11 may sequentially perform a lighting test on the display panels 20 included in the mother panel 10. To this end, the method shown in FIG. 11 may move the mother panel 10 by using the alignment apparatus 200 such that the display panels 20 may be sequentially aligned with the test apparatus 500.

In an embodiment, as described with reference to FIG. 1B, the test apparatus 500 may be located under the alignment apparatus 200. The method shown in FIG. 11 may overturn the mother panel 10 such that the pad PAD provided in the mother panel 10 faces the test apparatus 500 by using the rotating apparatus 400 rotatably coupled to the alignment apparatus 200 (i.e., face down).

Subsequently, the method shown in FIG. 11 may generate a defect management map by performing a lighting test on the mother panel 10, using the test apparatus 500 (S400).

As described with reference to FIGS. 7 to 9, the method shown in FIG. 11 may determine whether the light emitting elements LD normally emit light by applying a test voltage to the pad PAD (e.g., pads PAD respectively connected to the initialization power source Vint and the second driving power source VSS), measuring a current flowing through the light emitting elements LD in response to the test voltage, and comparing the measured current with a reference current (e.g., a current corresponding to the test voltage). In the above-described manner, the test apparatus 500 may acquire a lighting test result of each of the display panels 20.

As described with reference to FIG. 10, the test apparatus 500 may generate a defect management map, based on the lighting test result of each of the light emitting elements LD. The defect management map may include position information of the display panel 20 and test result information set corresponding thereto. The test result information may include a code value associated with a lighting test result of a corresponding display panel 20 or a defect type occurring in the corresponding display panel 20. For example, the defect management map may include a first code value representing that all light emitting elements LD in the display panel 20 normally emit light (i.e., normal lighting), a second code value representing that all the light emitting elements LD in the display panel 20 abnormally emit light or emit no light (i.e., abnormal lighting), and the like.

Subsequently, the method shown in FIG. 11 may acquire the display panel 20 from the mother panel 10, based on the defect management map (S500).

As described with reference to FIG. 1C, the method shown in FIG. 11 may cut or separate the mother panel 10 into multiple display panels 20 by using the cutting apparatus 600. The method shown in FIG. 11 may acquire only display panels 20 which may be good products (i.e., normally operated) by performing a cutting process on only the display panels 20 which may be good products, based on the defect management map.

In an embodiment, the method shown in FIG. 11 may irradiate only laser light onto the mother panel 10 by using the cutting apparatus 600, and move the mother panel 10 by using the alignment apparatus 200 such that the laser light may be irradiated onto the mother panel 10 along a predefined cutting line.

As described above, in the method, a bonding process between the first panel 11 and the second panel 12 and a lighting test process on the mother panel 10 can be performed by the bonding apparatus 300 and the test apparatus 500, which may be provided in one chamber 1100. In the method, the first panel 11 can be aligned with respect to the second panel 12 by using one alignment apparatus 200, and the mother panel 10 can be aligned with respect to the test apparatus 500. For example, since an alignment process for the bonding process and an alignment process for the lighting test process may be performed by using one alignment apparatus 200, the system 1000 can be simplified.

In the method, the defect management map can be generated through a lighting test on the mother panel 10, and a separation process (or scribing process) can be performed on only display panels 20 which may be good products, based on the defect management map. Thus, manufacturing processes of the display device can be simplified, as compared with a method of individually performing a lighting test on each of multiple display panels after a separation process of the display panels.

FIGS. 12 to 15 are diagrams schematically illustrating application examples of a display device manufactured in in accordance with embodiments of the disclosure.

Figure 12:
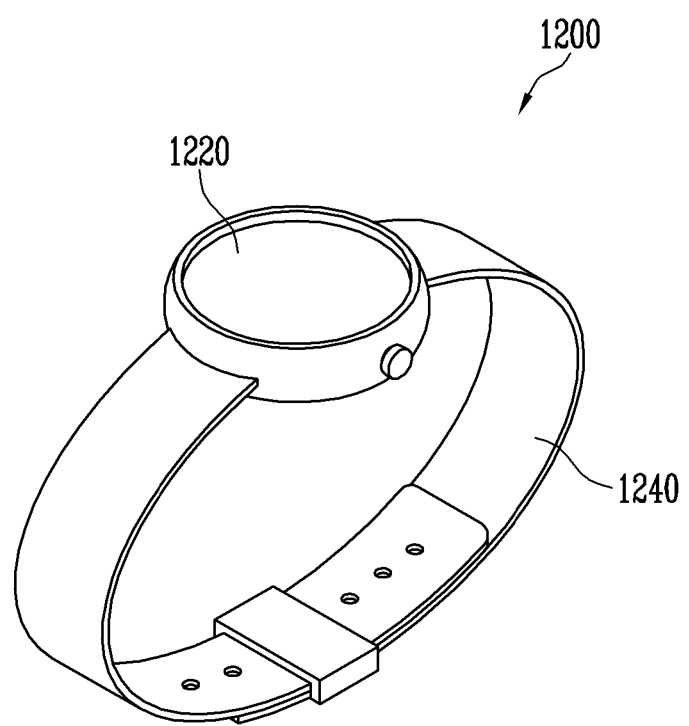
FIGS. 12 to 15 are diagrams schematically illustrating application examples of a display device manufactured in in accordance with embodiments of the disclosure.

First, referring to FIGS. 8 and 12, the display device (or display panel) may be applied to a smart watch 1200 including a display part 1220 and a strap part 1240.

The smart watch 1200 may be a wearable electronic device, and may have a structure in which the strap part 1240 may be mounted on a wrist of a user. The display device may be applied to the display part 1220, so that image data including time information can be provided to the user.

Figure 13:
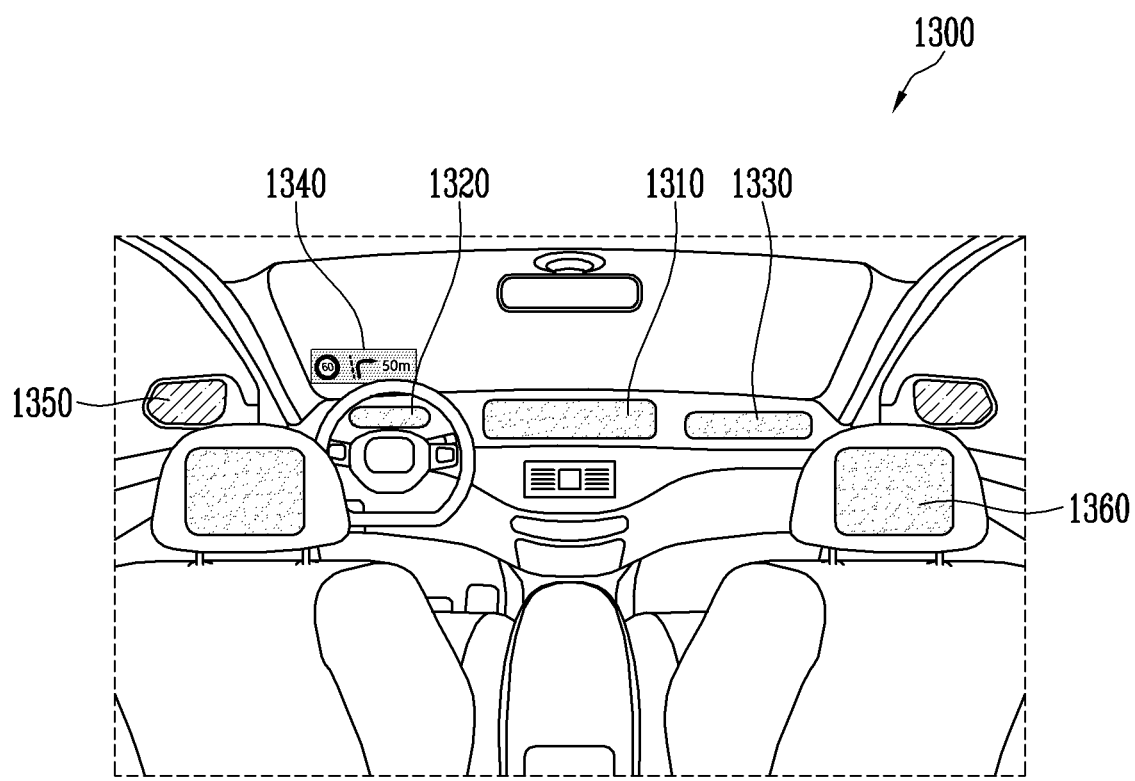

Referring to FIGS. 8 and 13, the display device may be applied to an automotive display 1300. The automotive display 1300 may mean an electronic device provided at the inside/outside of a vehicle to provide image data.

For example, the display device may be applied to at least one of an infotainment panel 1310, a cluster 1320, a co-driver display 1330, a head-up display 1340, a side mirror display 1350, and a rear seat display 1360, which may be provided in the vehicle.

Figure 14:
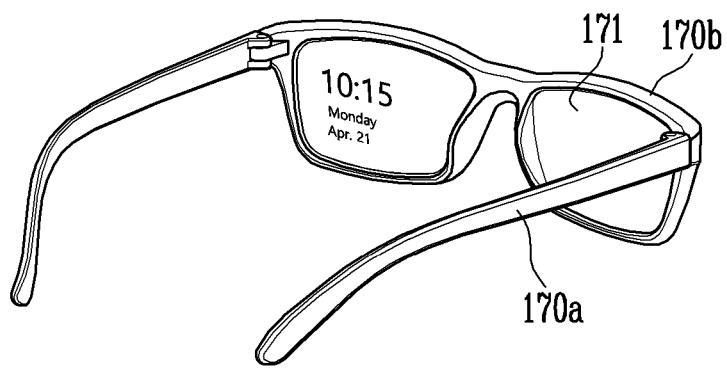

Referring to FIGS. 8 and 14, the display device may be applied to smart glasses including a frame 170 and a lens part 171. The smart glasses may be a wearable electronic device which can be worn on the face of a user, and may have a structure in which a portion of the frame 170 may be folded or unfolded. For example, the smart glasses may be a wearable device for Augmented Reality (AR).

The frame 170 may include a housing 170b supporting the lens part 171 and a leg part 170a for allowing the user to wear the smart glasses. The leg part 170a may be connected to the housing 170b by a hinge to be folded or unfolded.

A battery, a touch pad, a microphone, a camera, and the like may be built in the frame 170. A projector for outputting light, a processor for controlling a light signal, etc., and the like may be built in the frame 170.

The lens part 171 may be an optical member which allows light to be transmitted therethrough or allows light to be reflected thereby. The lens part 171 may include glass, transparent synthetic resin, etc., or a combination thereof.

The lens part 171 may allow an image caused by a light signal transmitted from the projector of the frame 170 to be reflected by a rear surface (e.g., a surface in a direction facing eyes of the user) of the lens part 171, thereby enabling the eyes of the user to recognize the image. For example, as shown in the drawing, the user may recognize information including time, data, and the like, which may be displayed on the lens part 171. For example, the lens part 171 may be a kind of display device, and the display device may be applied to the lens part 171.

Figure 15:
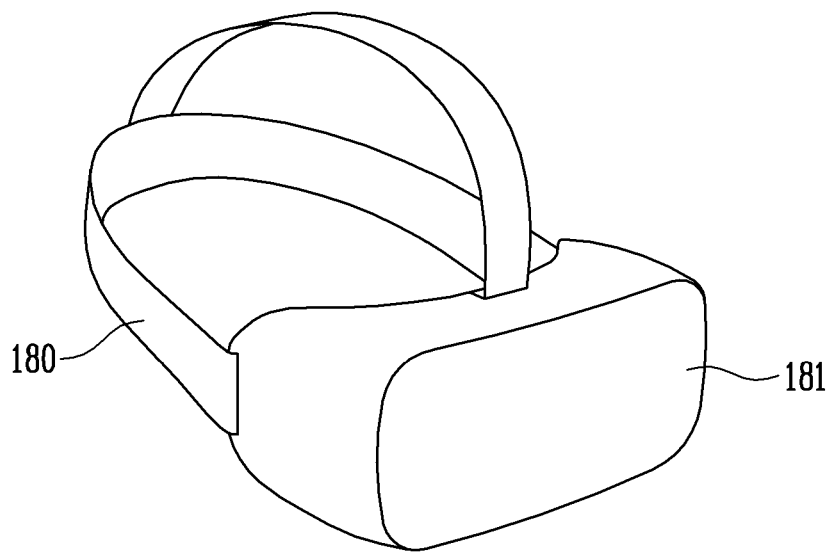

Referring to FIGS. 8 and 15, the display device may be applied to a Head Mounted Display (HMD) including a head mounted band 180 and a display accommodating case 181. The HMD may be a wearable electronic device which can be worn on the head of a user.

The head mounted band 180 may be a part connected to the display accommodating case 181, to fix the display accommodating case 181. In the drawing, it is illustrated that the head mounted band 180 can surround a top surface and both side surfaces of the head of the user. However, the disclosure is not limited thereto. The head mounted band 180 may be used to fix the HMD to the head of the user, and may be formed in the shape of a glasses frame or a helmet.

The display accommodating case 181 may accommodate the display device, and may include at least one lens. The at least one lens may be a part which provides an image to the user. For example, the display device may be applied to a left-eye lens and a right-eye lens, which may be implemented in the display accommodating case 181.

In accordance with the disclosure, a system may have a bonding apparatus and a test apparatus in a chamber, and may perform a bonding process between a first panel and a second panel and a lighting test process on a mother panel. By using an alignment apparatus, the system may align the first panel with respect to the second panel, and may align the mother panel with respect to the test apparatus. For example, since an alignment unit used in the bonding process and an alignment unit used in the lighting test process may be implemented as one alignment apparatus, a system can be simplified.

In accordance with the disclosure, a method may generate a defect management map through a lighting test on a mother panel, and may perform a separation process (or scribing process) on only display panels which may be good products, based on the defect management map. Thus, manufacturing processes of the display device can be simplified, as compared with a method of individually performing a lighting test on each of multiple display panels after a separation process of the display panels.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used individually or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims including equivalents thereof.

What is claimed is:

1. A method of manufacturing a display device, the method comprising:
   aligning a first panel and a second panel by using an alignment apparatus, wherein
      the first panel includes pixel driving circuits arranged on a first substrate,
      each of the pixel driving circuits includes a transistor and a pixel electrode connected to the transistor, and
      the second panel includes light emitting elements arranged on a second substrate;
   bonding an end portion of at least one of the light emitting elements to the pixel electrode by using a bonding apparatus;
   performing a lighting test on a mother panel by using a test apparatus, wherein the mother panel includes the first panel and the second panel, and is divided into a plurality of display panels in plan view; and
   generating a defect management map for the plurality of display panels, based on a result of the lighting test.

2. The method of claim 1, wherein the alignment apparatus, the bonding apparatus, and the test apparatus are provided in a chamber.

3. The method of claim 1, wherein
   the first panel is fixed onto the alignment apparatus, and
   the aligning of the first panel and the second panel includes:
      adjusting a position of the first panel with respect to the second panel on a first plane by using the alignment apparatus, wherein the first plane is defined by a first direction and a second direction; and
      moving the first panel in a third direction by using the alignment apparatus such that the first panel contacts the second panel.

4. The method of claim 1, wherein the bonding of the end portion of the at least one of the light emitting elements to the pixel electrode includes irradiating laser light or applying heat between the end portion of the at least one of the light emitting elements and the pixel electrode.

5. The method of claim 4, wherein the bonding of the end portion of the at least one of the light emitting elements to the pixel electrode further includes separating the second substrate from the mother panel.

6. The method of claim 1, wherein the performing of the lighting test on the mother panel includes:
   adjusting a position of the mother panel with respect to the test apparatus by using the alignment apparatus; and
   moving the mother panel toward the test apparatus by using the alignment apparatus such that a probe pin of the test apparatus electrically contacts a pad which is provided in the mother panel and is electrically connected to the transistor.

7. The method of claim 6, wherein the performing of the lighting test on the mother panel further includes:
   moving the mother panel by using the alignment apparatus such that the plurality of display panels are sequentially aligned with the test apparatus; and
   sequentially performing the lighting test on the plurality of display panels by using the test apparatus.

8. The method of claim 6, wherein
   the alignment apparatus is located on the test apparatus, and
   the performing of the lighting test on the mother panel further includes overturning the mother panel such that the pad provided in the mother panel faces the test apparatus by using a rotating apparatus coupled to the alignment apparatus.

9. The method of claim 6, wherein the performing of the lighting test on the mother panel further includes:
applying a test voltage to the pad;
measuring a current flowing through the pad to the at least one of the light emitting elements; and
determining whether the at least one of the light emitting elements normally emits light by comparing the current with a reference current.

10. The method of claim 1, wherein
the defect management map includes:
position information of each of the plurality of display panels; and
a test result information set corresponding to the position information, and
the test result information includes:
a first code value representing that all first light emitting elements provided in a corresponding display panel normally emit light; or
a second code value representing that the first light emitting elements abnormally emit light or emit no light.

11. The method of claim 1, further comprising acquiring at least one display panel from the mother panel, based on the defect management map.

12. The method of claim 11, wherein the acquiring of the at least one display panel from the mother panel incudes separating, from the mother panel, the at least one display panel which is normally operating among the plurality of display panels, based on the defect management map.

13. The method of claim 11, wherein the acquiring of the at least one display panel from the mother panel includes:
irradiating laser light onto the mother panel by using a cutting apparatus; and
moving the mother panel by using the alignment apparatus such that the laser light is irradiated onto the mother panel along a predefined cutting line.

* * * * *